United States Patent
Hsieh

(10) Patent No.: US 8,519,477 B2
(45) Date of Patent: Aug. 27, 2013

(54) TRENCH MOSFET WITH TRENCHED FLOATING GATES AND TRENCHED CHANNEL STOP GATES IN TERMINATION

(75) Inventor: Fu-Yuan Hsieh, New Taipei (TW)

(73) Assignee: Force Mos Technology Co., Ltd., New Taipei (TW)

(*) Notice: Subject to any disclaimer, the term of this patent is extended or adjusted under 35 U.S.C. 154(b) by 0 days.

(21) Appl. No.: 13/537,102

(22) Filed: Jun. 29, 2012

(65) Prior Publication Data

US 2012/0261737 A1 Oct. 18, 2012

Related U.S. Application Data

(63) Continuation-in-part of application No. 13/169,314, filed on Jun. 27, 2011, which is a continuation-in-part of application No. 12/591,467, filed on Nov. 20, 2009, now Pat. No. 7,989,887.

(51) Int. Cl.
*H01L 29/76* (2006.01)
*H01L 29/94* (2006.01)

(52) U.S. Cl.
USPC ........... 257/330; 257/329; 257/331; 257/332; 257/341; 438/259; 438/270; 438/271

(58) Field of Classification Search
USPC .................. 257/329–333, 341, 374, E29.262; 438/259, 270, 271
See application file for complete search history.

(56) References Cited

U.S. PATENT DOCUMENTS 8,022,476 B2 * 9/2011 Pang .............................. 257/334
2006/0273385 A1 * 12/2006 Hshieh .......................... 257/330

* cited by examiner

*Primary Examiner* — Theresa T Doan
(74) *Attorney, Agent, or Firm* — Bacon & Thomas, PLLC

(57) ABSTRACT

A trench MOSFET comprising multiple trenched floating gates in termination area is disclosed. The multiple trenched floating gates have trench depth equal to or deeper than body junction of body regions in active area. The trench MOSFET further comprises at least one trenched channel stop gate around outside of the trenched floating gates and connected to at least one sawing trenched gate extended into scribe line for prevention of leakage path formation between drain and source regions.

17 Claims, 26 Drawing Sheets

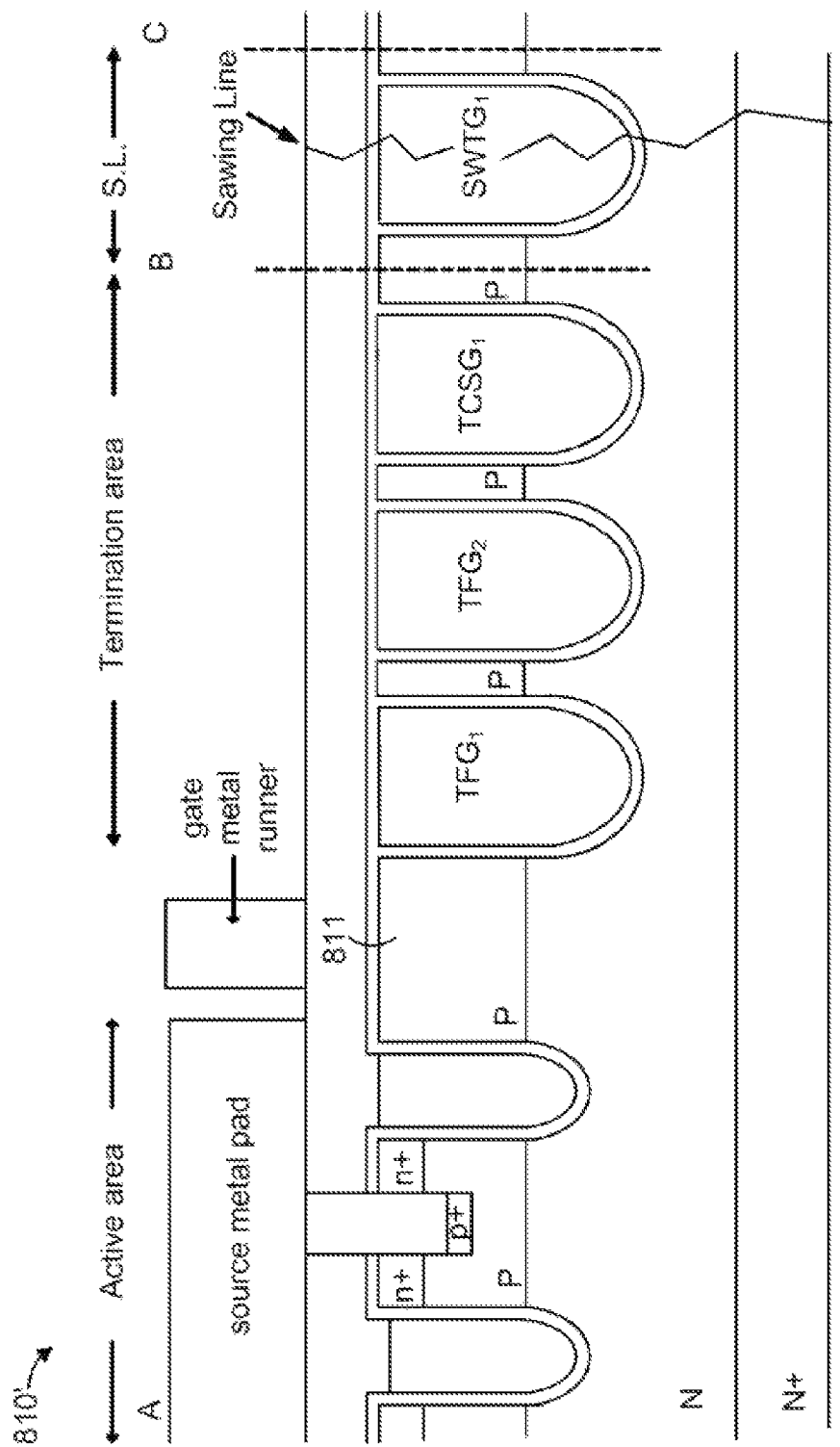

TRENCH MOSFET WITH TRENCHED FLOATING GATES AND TRENCHED CHANNEL STOP GATES IN TERMINATION

CROSS REFERENCE TO RELATED APPLICATIONS

This application is a Continuation-In-Part (CIP) of U.S. patent application Ser. No. 13/169,314 of the same inventor, filed on Jun. 27, 2011, entitled "trench MOSFET with trenched floating gates in termination", which is a Continuation-In-Part of U.S. patent application Ser. No. 12/591,467 of the same inventor, filed on Nov. 20, 2009, now U.S. Pat. No. 7,989,887.

FIELD OF THE INVENTION

This invention relates generally to the cell structure, device configuration and fabrication process of power semiconductor devices. More particularly, this invention relates to a novel and improved cell structure, device configuration and improved process for fabricating trench metal-oxide-semiconductor-field-effect-transistors (MOSFETs) with trenched floating gates and trenched channel stop gates in termination.

BACKGROUND OF THE INVENTION

Typical structures of trench metal-oxide-semiconductor-field-effect-transistors (MOSFETs) having trenched floating gates as termination in prior arts are encountering technical problems. For example, in U.S. Pat. No. 6,462,376, a trench MOSFET was disclosed with n+ source regions disposed in termination area comprising multiple trenched floating gates, as shown in FIG. 1A. In the termination area, a plurality of n+ source regions 120 are disposed between two adjacent of the trenched floating gates 111. This kind of structure will cause heavily leakage current between drain region and the source region because channel region is easily turned on in the termination area due to a plurality of P body regions 108 having floating voltage and the trenched floating gates 111 are not shorted together with the n+ source regions 120 at drain/source reversed bias. An electrical current will flow from the drain region rough the channel region between two adjacent of the trenched floating gates 111 in the termination area to the n+ source regions 120 in active area.

Please refer to FIG. 1B for another prior art U.S. Pat. No. 7,511,339 which disclosed another trench MOSFET structure without having source regions in the termination area but with depth of the trenched floating gates 110 (TFd) shallower than depth of floating deep P body regions 130 (Pd). However, from experimental result of the relationship between breakdown voltage (BV) and difference bet TFd and Pd in FIG. 2, it can be seen that, the breakdown voltage is significantly degraded as the difference (TFd-Pd) is getting smaller when TFd<Pd, thus causing low breakdown voltage in the termination area due to poor isolation between drain region and source region by the trenched floating gates 110 having shallower depth in the termination area. The floating deep P body regions 130 are electrically connected together by charge depletion of the floating deep P body regions 130 at drain/source reversed bias because the trenched floating gates 110 is shallower than the floating deep P body regions 130. Therefore, an electrically current will directly flow from edge of the termination area to the source regions 131 in the active area without being blocked by the trenched floating gates 110 in the termination area.

Therefore, there is still a need in the art of the semiconductor device design and fabrication, particularly for trench MOSFET design and fabrication, to provide a novel cell structure, device configuration and fabrication process that would resolve these difficulties and design limitations. Specifically, it is desirable to maintain breakdown voltage in the termination area of a trench MOSFET.

SUMMARY OF THE INVENTION

The present invention provides trench MOSFET having a plurality of transistor cells in active area and multiple trenched floating gates in termination area, specifically, trench depth of the multiple trenched floating gates in the termination area is equal to or deeper than body junction of body regions surrounding the trenched floating gates without having source regions disposed wherein to maintain high breakdown voltage. Some preferred trench MOSFET transistor cells exhibit low gate-to-drain charge Qgd.

According to one aspect, the invention features a trench MOSFET having a plurality of transistor cells in active area and multiple trenched floating gates in termination area, further includes: an epitaxial layer of a first conductivity type onto a substrate of the first conductivity type, wherein the epitaxial layer has a lower doping concentration than the substrate; a plurality of source regions of the first conductivity type formed near top surface of the epitaxial layer only in the active area, wherein the source regions are connected to a source metal pad and having a higher doping concentration than the epitaxial layer; a plurality of first type body regions of a second conductivity type opposite to the first conductivity type formed underneath the source regions in the active area and connected to the source metal pad; a plurality of second type body regions of the second conductivity type formed in the epitaxial layer around outside of the active area including the termination area, wherein the source regions being not disposed on top of the second type body regions; a plurality of first type trenched gates in the active area, surrounded by the source regions and the first type body regions; at least one second type trenched gate surrounded by the second type body regions and extending to the first type trenched gates for gate contact, wherein the second type trenched gate is connected to a gate metal pad for wire bonding; a plurality of trenched floating gates formed in parallel in the termination area around outside of the active area, wherein the trenched floating gates are surrounded by the second type body regions and having floating voltage, and having trench depth equal to or deeper than body junction of the second type body regions; at least one trenched channel stop gate formed in the termination area and around outside of the trenched floating gates, each the trenched channel stop gate being connected to at least one sawing trenched gate cross ascribe line, wherein each the sawing trenched gate is extended across a scribe line and electrically shorted to the second type body regions, the epitaxial layer and a drain region at the scribe line after die sawing. In some preferred embodiment, the first conductivity type is N type and the second conductivity type is P type. Alternatively, the first conductivity type can be P type and the second conductivity type can be N type.

According to another aspect of the present invention, in some preferred embodiments, the second type body region located adjacent to the active area is connected to the source metal pad. In some other preferred embodiments, the second type body region is not connected with the source metal pad but having floating voltage.

According to another aspect of the present invention, in some preferred embodiments, there are only one trenched channel stop gate surrounding outside of the trenched floating gates, wherein the only one trenched channel stop gate is connected to at least one sawing trenched gate cross the scribe line. In some other preferred embodiment, there are multiple trenched channel stop gates surrounding outside of the multiple trenched floating gates, wherein each of the multiple trenched channel stop gates is connected to at least one sawing trenched gate cross the scribe line.

According to another aspect of the present invention, in some preferred embodiments, the multiple trenched floating gates in the termination area have same trench width and same trench depth as the first type trenched gates in the active area. In some other preferred embodiments, the multiple trenched floating gates in the termination area have greater trench width and greater trench depth than the first type trenched gates in the active area. More preferred the trench width of the multiple trenched floating gates in the termination area increases toward the edge of the termination area. In some other preferred embodiments, the trench width of the multiple trenched floating gates in the termination area can be implemented to decrease toward the edge of the termination area.

According to another aspect of the present invention, in some preferred embodiments, trench space between every two adjacent of the multiple trenched floating gates in the termination area is equal. In some other preferred embodiments, the trench space between every two adjacent of the trenched floating gates in the termination area is increased toward the edge of the termination area.

According to another aspect of the present invention, in some preferred embodiments, each of the first type trenched gates in the active area is deeper than the first type body regions. In some other preferred embodiments, the body junction of the first type body regions is greater than or equal to the trench depth of the first type trenched gates in the active area and the trench MOSFET further comprises a doped region of the first conductivity type with doping concentration higher than the epitaxial layer and wrapping bottoms of the first type trenched gates, the second type trenched gate, the sawing trenched gate and the multiple trenched floating gates.

According to another aspect of the present invention, in some preferred embodiments, the at least one second type trenched gate for gate contact is only disposed underneath the gate metal pad. There is no gate metal runner surrounding outside of the active area or the source metal pad. In some other preferred embodiments, the trench MOSFET further comprises a gate metal runner surrounding outside of the active area and extending to the gate metal pad used for wire bonding, wherein the second type trenched gate for gate contact is disposed not only underneath the gate metal pad, but also underneath the gate metal runner.

Preferred embodiments include one or more of the following features: the trench MOSFET further comprises a trenched source-body contact filled with a contact metal plug and surrounded by a body contact region of the second conductivity type, wherein the trenched source-body contact is penetrating through a contact insulation layer, the source regions and extending into the first type body regions in the active area to connect the source regions and the first type body regions to the source metal pad, wherein the body contact region has a higher doping concentration than the first type body regions to reduce contact resistance between the contact metal plug and the first type body regions; the trench MOSFET further comprises a trenched body contact filled with the contact metal plug, penetrating through the contact insulation layer and extending into the second type body region adjacent the active area; the contact metal plug can be implemented by using tungsten plug padded by a barrier layer of Ti/TiN or Co/TiN or Ta/TiN; the transistor cells in the active area are closed cells; the transistor cells in the active area are stripe cells; the first type trenched gates, the second type trenched gate, the sawing trenched gate and the trenched floating gates can be each implemented by filling gate conductive layer padded by a gate oxide layer into a gate trench, wherein the gate conductive layer is doped poly-silicon layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 18C is a cross-section view showing another preferred A-B-C cross section of FIG. 18A.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
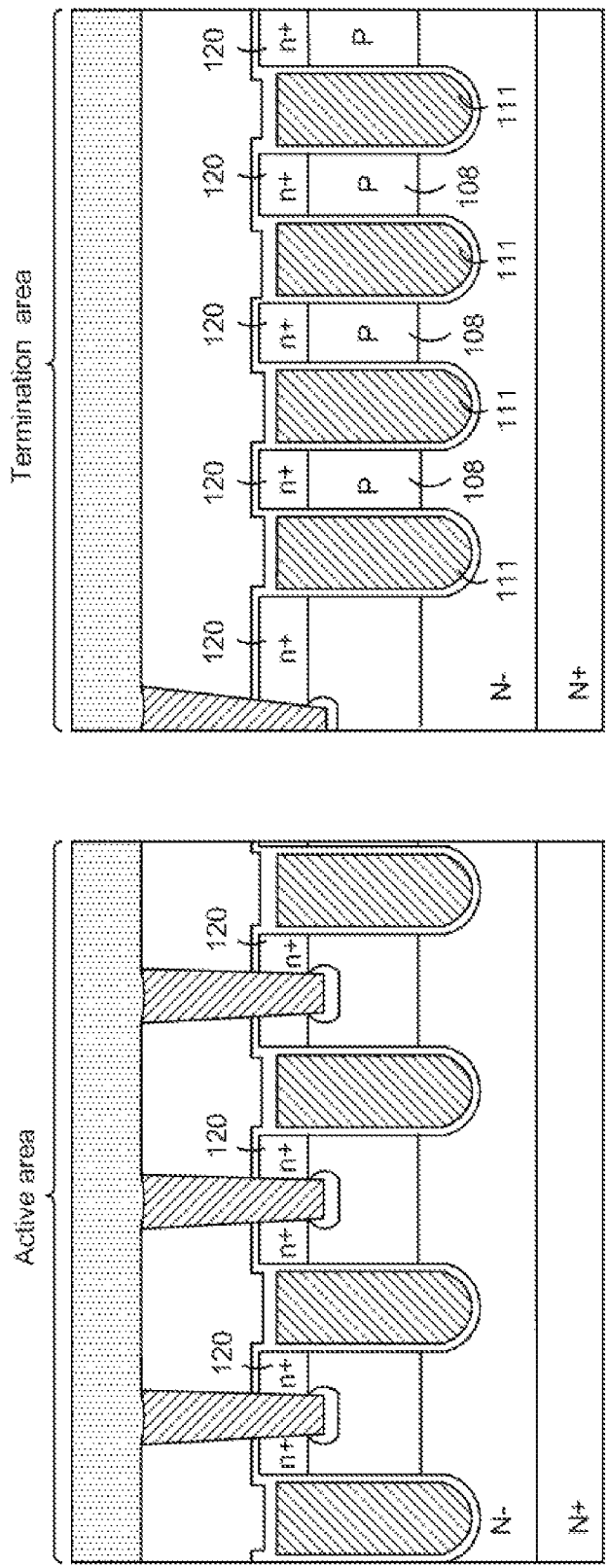
FIG. 1A is a cross-sectional view of a trench MOSFET in prior art.
Figure 1B:
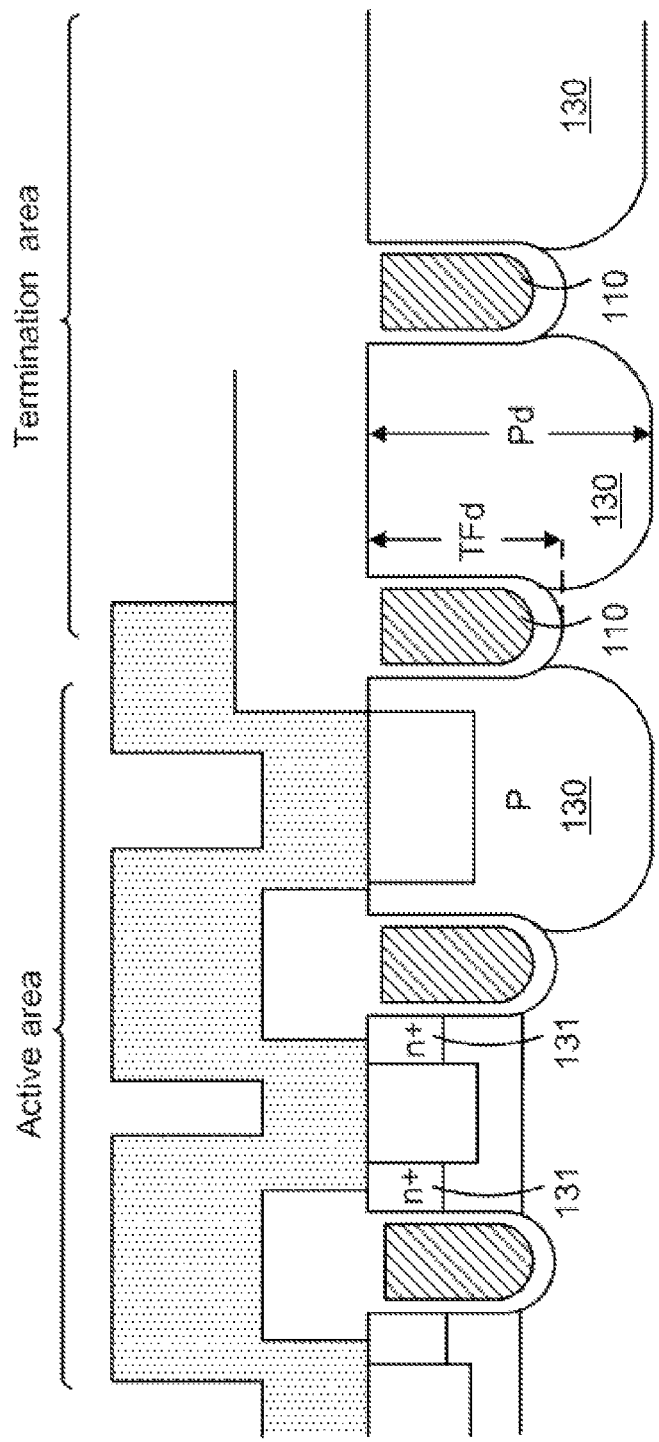
FIG. 1B is a cross-sectional view of another trench MOSFET in prior art.
Figure 2:
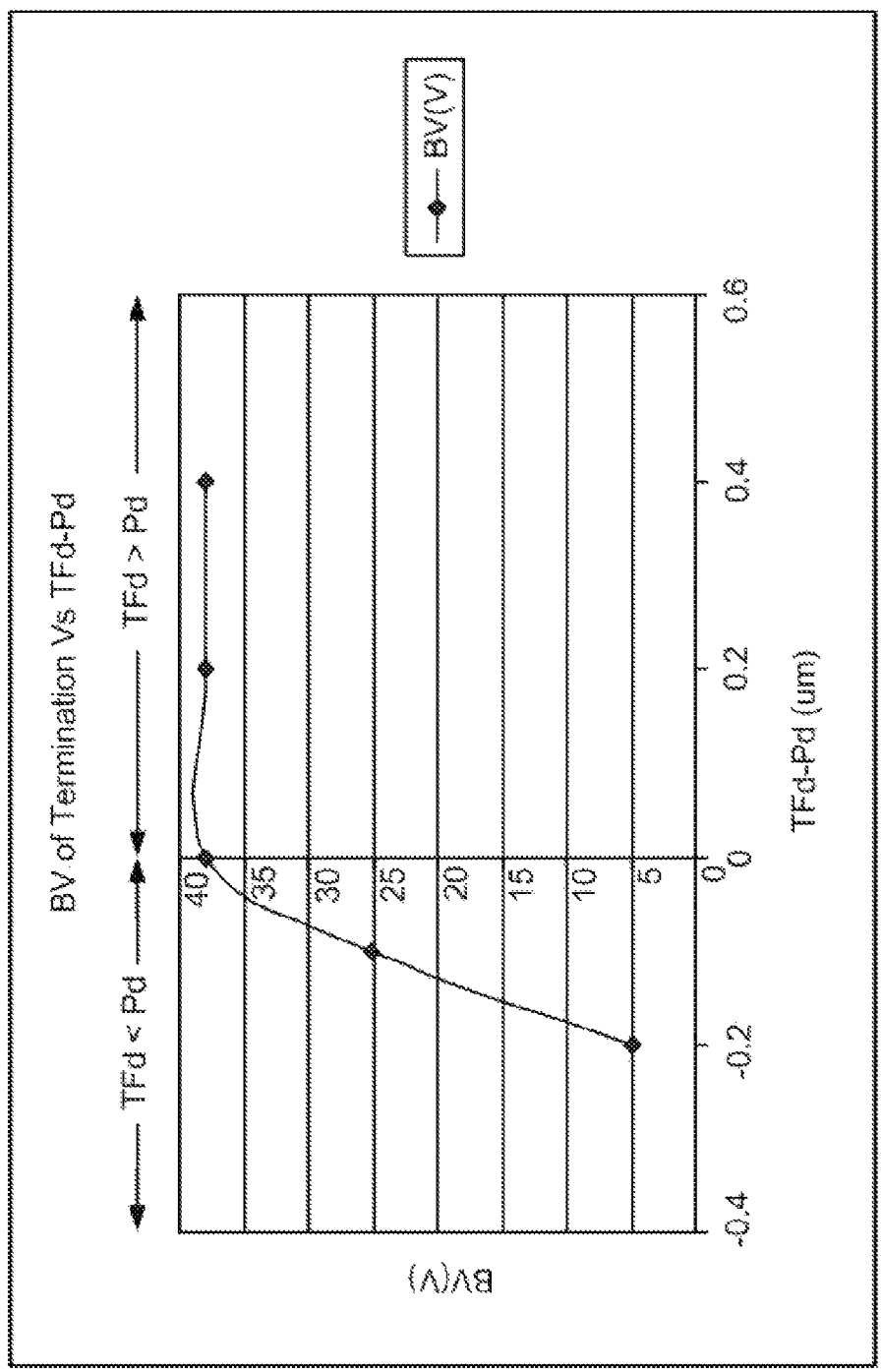
FIG. 2 is an experimental curve showing the relationship between breakdown voltage (BV) and the difference between trench depth of trenched floating gates and body junction of body region (TFd-Pd).
Figure 3:
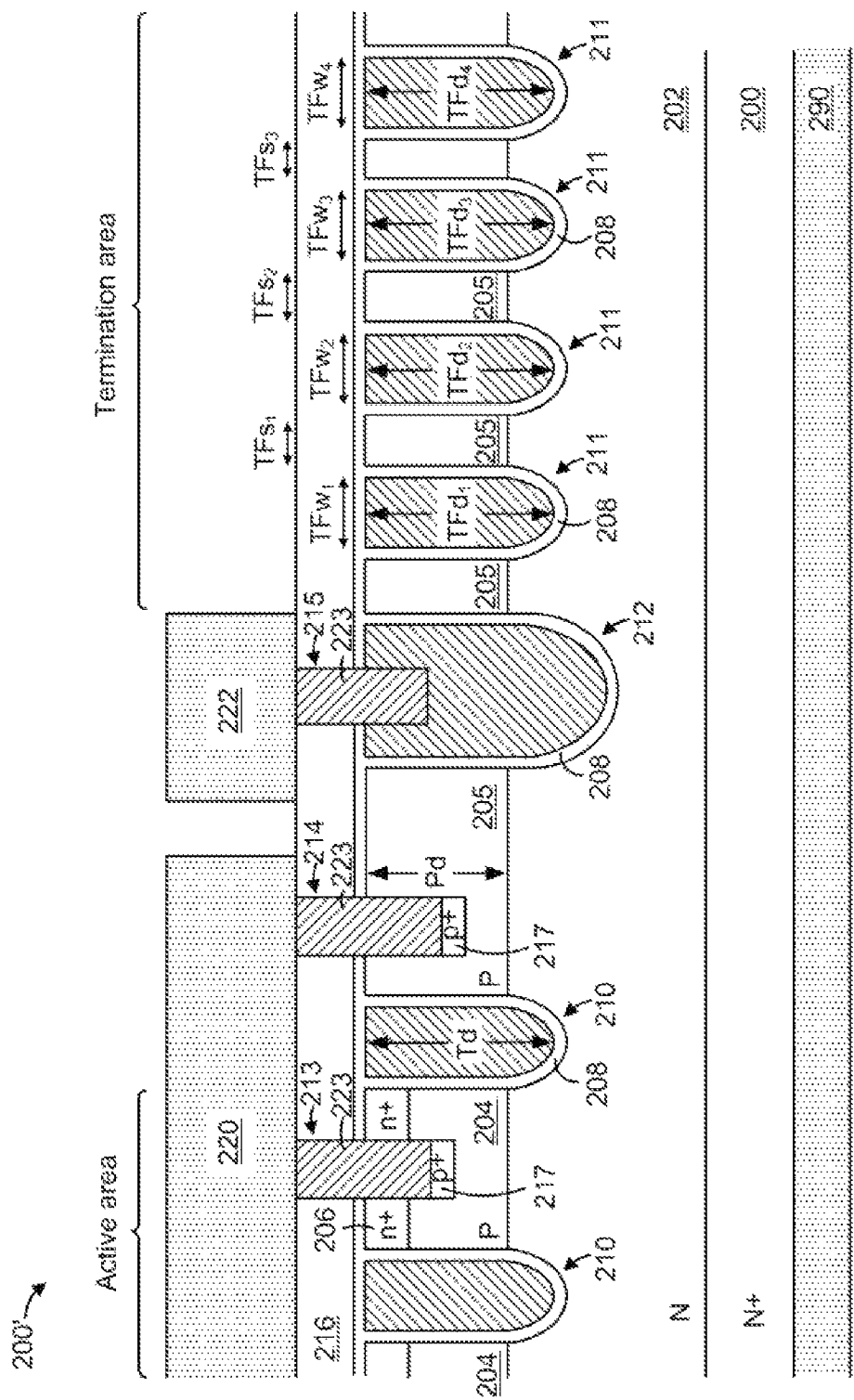
FIG. 3 is a cross-sectional view of a preferred embodiment according to the present invention.

Please refer to FIG. 3 for a preferred embodiment of this invention wherein an N-channel trench MOSFET 200' is formed in an N epitaxial layer 202 onto an N+ substrate 200 with a metal layer on rear side as drain metal 290 (the conductivity type here is not to be taken in a limiting sense, which means it also can be implemented to be a P-channel trench MOSFET formed in a P epitaxial layer onto a P+ substrate). Inside the N epitaxial layer 202, a plurality of first type trenched gates 210 are formed in an active area, at least one second type trenched gate 212 having greater trench width and greater trench depth than the first type trenched gates 210 is formed adjacent the active area and extending to the first type trenched gates 210 for gate contact, and a plurality of trenched floating gates 211 are formed in a termination area. In an upper portion of the N epitaxial layer 202, a plurality of first type P body regions 204 having n+ source regions 206 whereon are extending between every two adjacent of the first type trenched gates 210 in the active area; and a plurality of second type P body regions 205 without having source regions whereon are formed around outside the active area. All the trenched gates are each formed by filling a doped poly-silicon layer padded by agate oxide layer 208 in a gate trench. Furthermore, the multiple trenched floating gates 211 have same trench width and same trench depth as the first type trenched gates 210 in the active area, meanwhile, trench space between every two adjacent of the multiple trenched floating gates 211 in the termination area is equal or increased toward the edge of the termination area. Specifically, the trench depth of the multiple trenched floating gates 211 ($TFd_1$, $TFd_2$, $TFd_3$, $TFd_4$ . . . , as illustrated in FIG. 3) must be equal to or deeper than body junction of the second type P body regions 205 (Pd, as illustrated in FIG. 3) surrounding the multiple trenched floating gates 211 without having the source regions disposed whereon to maintain high breakdown voltage while preventing heavily leakage current, and the trench depth of the first type trenched gates 210 is deeper than the body junction of the first type P body regions 204. The N-channel trench MOSFET 200' further comprises: a plurality of trenched source-body contacts 213 each filled with a contact metal plug 223, penetrating a contact insulation layer 216, the n+ source regions 206 and extending into the first type P body regions 204; a trenched body contact 214 filled with the contact metal plug 223, penetrating through the contact insulation layer 216 and extending into the second type P body region 205 adjacent the active area; and at least one trenched gate contact 215 filled with the contact metal plug 223, penetrating through the contact insulation layer 216 and extending into the at least one second type trenched gate 212. A p+ body contact region 217 is formed wrapping at least bottom of each of the trenched source-body contacts 213 and the trenched body contact 214 to further reduce contact resistance between the contact metal plug 223 and the body regions. The N-channel trench MOSFET 200' further comprises a source metal pad 220 and a gate metal 222 (which is a gate metal pad or gate metal runner connecting to the gate metal pad), the source metal pad 220 is connected to the n+ source regions 206, the first type P body regions 204 and the second type P body region 205 adjacent the active area via the contact metal plugs 223 filled into the trenched source-body contacts 213 and the trenched body contact 214, the gate metal 222 is connected to the at least one second type trenched gate 212 via the contact metal plug 223 filled into the trenched gate contact 215 for gate contact, wherein each of the contact metal plugs 223 can be implemented by using a tungsten metal plug padded by a harrier layer of Ti/TiN or Co/TiN or Ta/TiN. Since the structure does not have n+ source regions between two adjacent trenched floating gates 211, no current will flow from drain region through channel region to the source regions 206 in the active area even the trenched floating gates 211 are turned on. The N-channel trench MOSFET 200' further comprises a plurality of closed transistor cells, as shown in FIG. 4 or a plurality of stripe transistor cells, as shown in FIG. 5.

Figure 4:
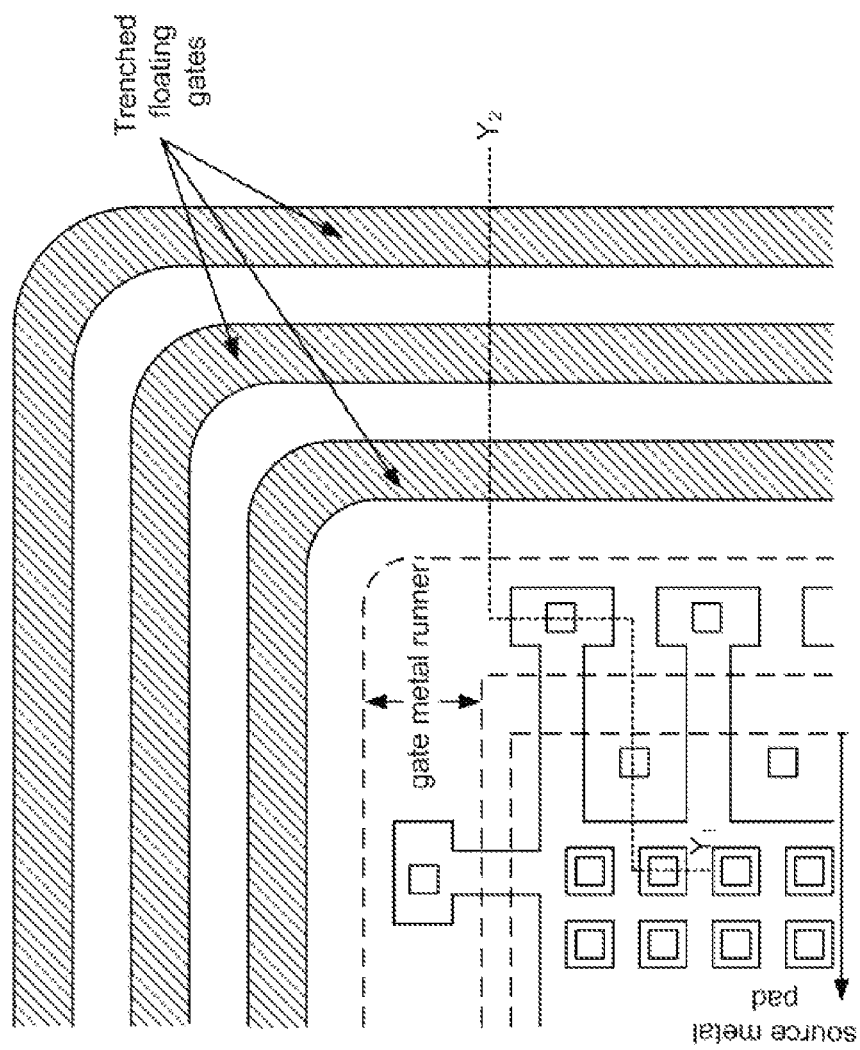
FIG. 4 is a top view of some preferred embodiments having closed cells with multiple trenched floating gates in the termination area according to the present invention.
Figure 5:
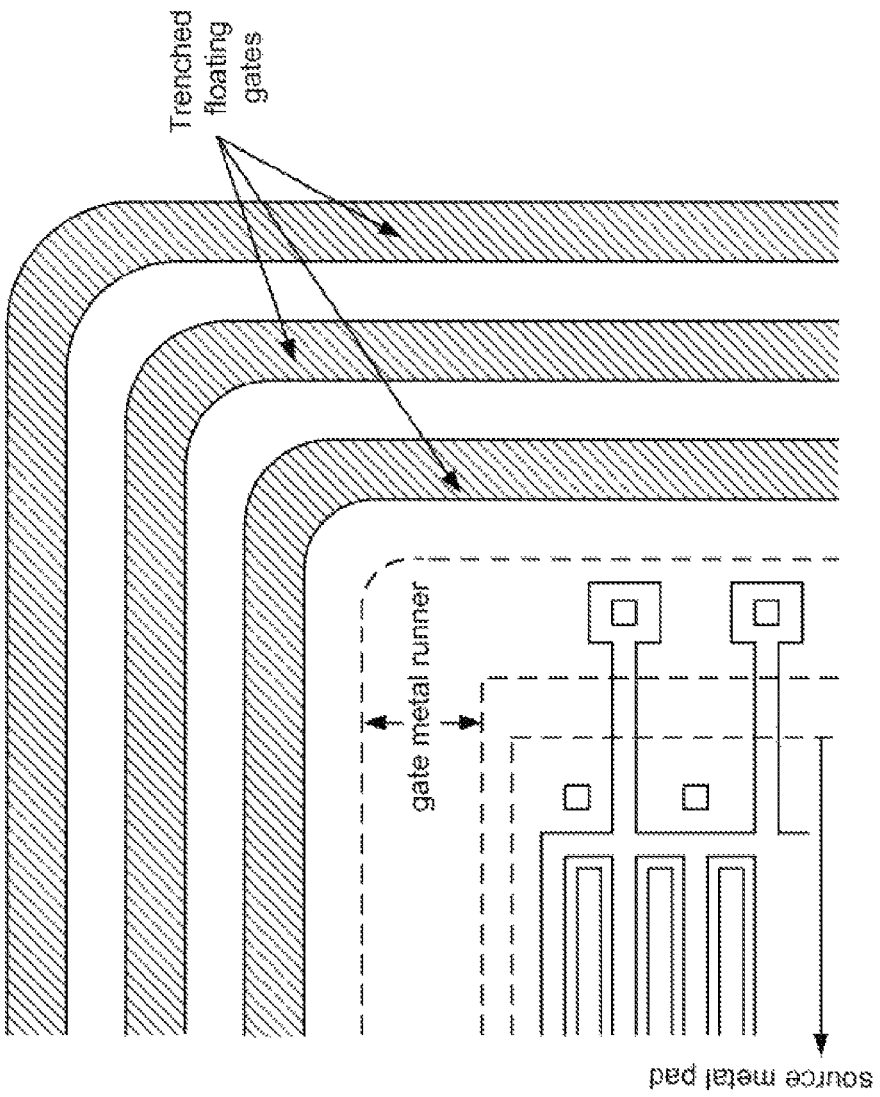
FIG. 5 is a top view of some preferred embodiments having stripe cells with multiple trenched floating gates it the termination area according to the present invention.
Figure 6:
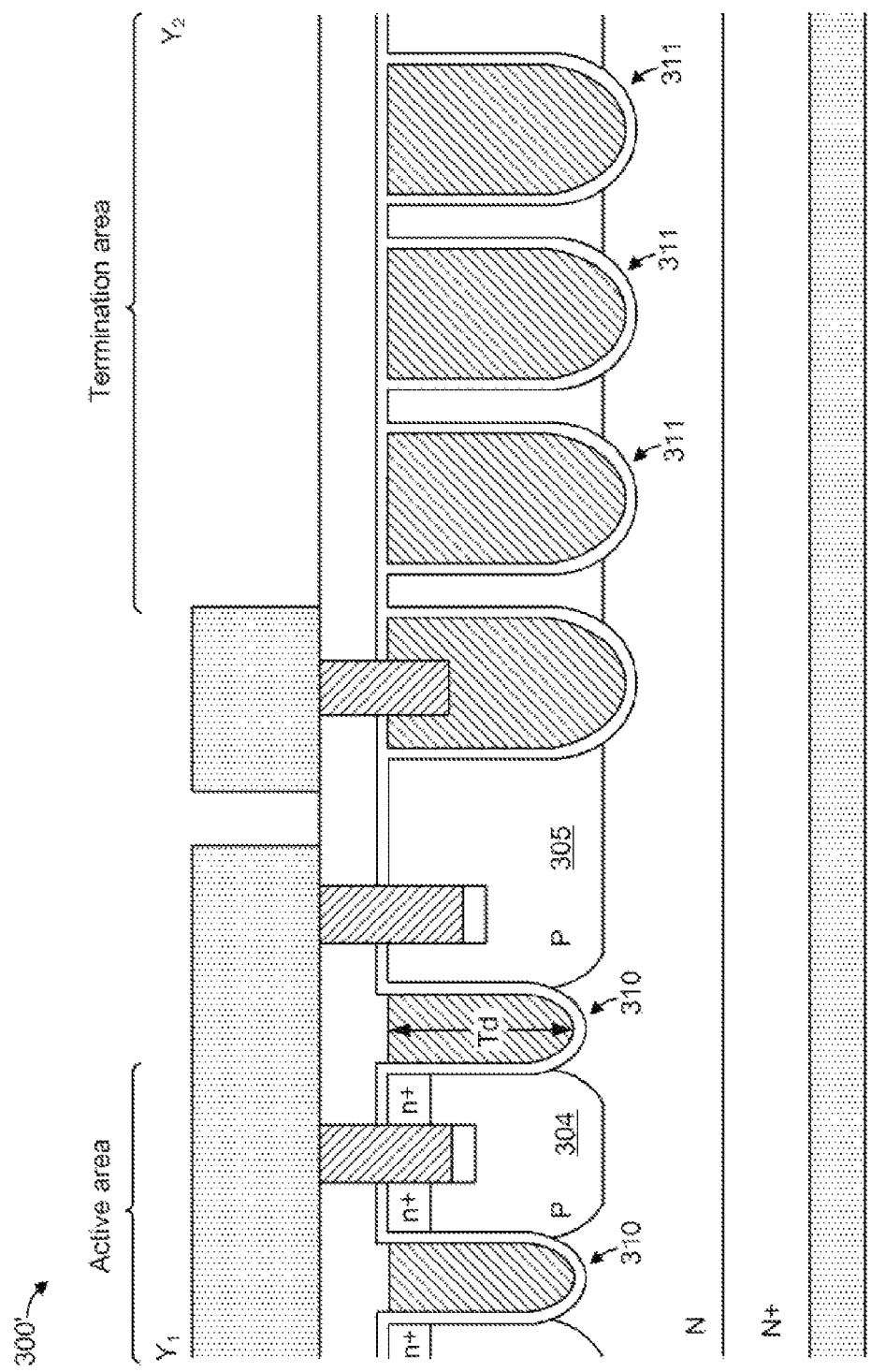
FIG. 6 is a cross-sectional view of another preferred embodiment according to the present invention.
Figure 7:
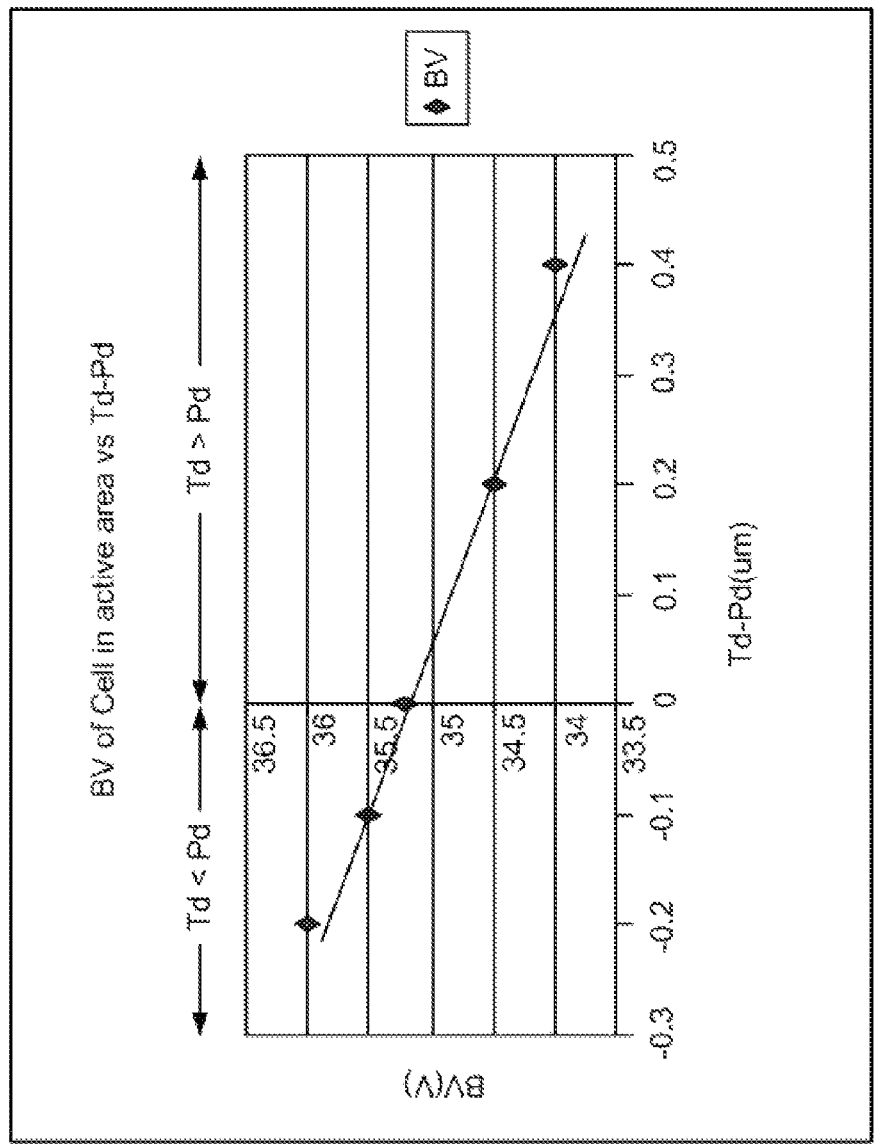
FIG. 7 is an experimental curve showing the relationship between breakdown voltage (BV) in active region and the difference between trench depth of the first type trenched gates and body junction of the first type body regions in the active area (Td-Pd).
Figure 8:
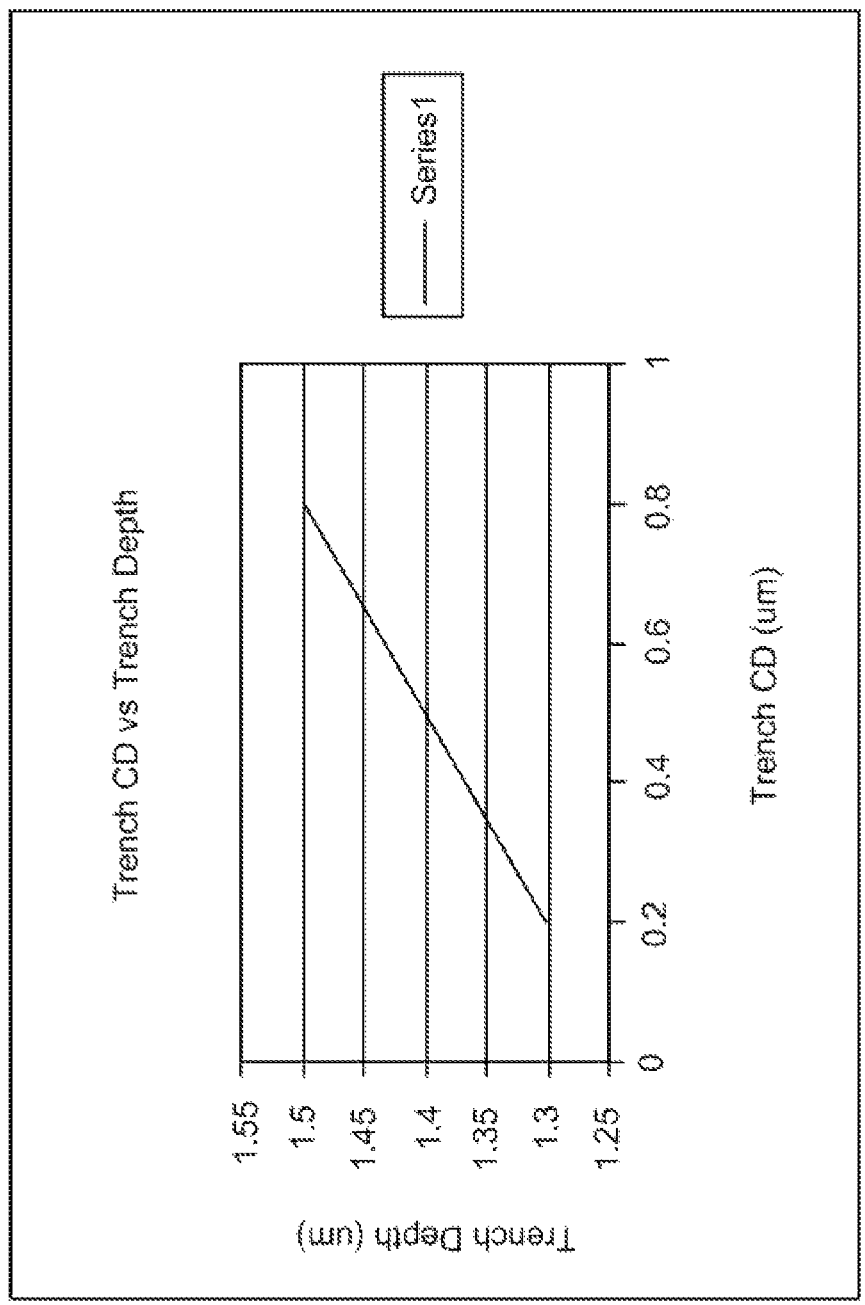
FIG. 8 is an experimental curve showing the relationship between trench CD (Critical Dimension and trench depth.

FIG. 6 shows another preferred embodiment of the present invention, which is also a preferred $Y_1$-$Y_2$ cross section of FIG. 4, wherein the N-channel trench MOSFET 300' (the conductivity type here is not to be taken in a limiting sense, which means it also can be implemented to be a P-channel trench MOSFET formed in a P epitaxial layer onto a P+ substrate) has a similar structure to FIG. 3 except that, the multiple trenched floating gates 311 in the termination area have same trench width ($TFw_1$, $TFw_2$, $TFw_3$, . . . , as illustrated in FIG. 3) and same trench depth which are greater than the first type trenched gates 310 in the active area. Meanwhile, the trench depth of the first type trenched gates 310 (Td, as illustrated in FIG. 6) is shallower than the body junction of the first type P body regions 304 and the second type P body regions 305 to keep enough breakdown voltage in the active area and lower gate-to-drain charge Qgd for the reason that, as shown in FIG. 7, when Td is greater, the breakdown voltage is lower in the active area and the Qgd is thus higher. By referring FIG. 8 which shows a relationship between trench depth and trench CD (Critical Dimension) of a gate trench, the structure can be achieved by using single trench etch because the multiple trenched floating gates 311 have trench width greater than the first type trenched gates 310, resulting in greater trench depth of the multiple trenched floating gates 311 than the first type trenched gates 310. The preferred embodiment has low gate charge due to shallow trench depth while the breakdown voltage is able to be maintained in the termination area without adding extra trench etch.

Figure 9:
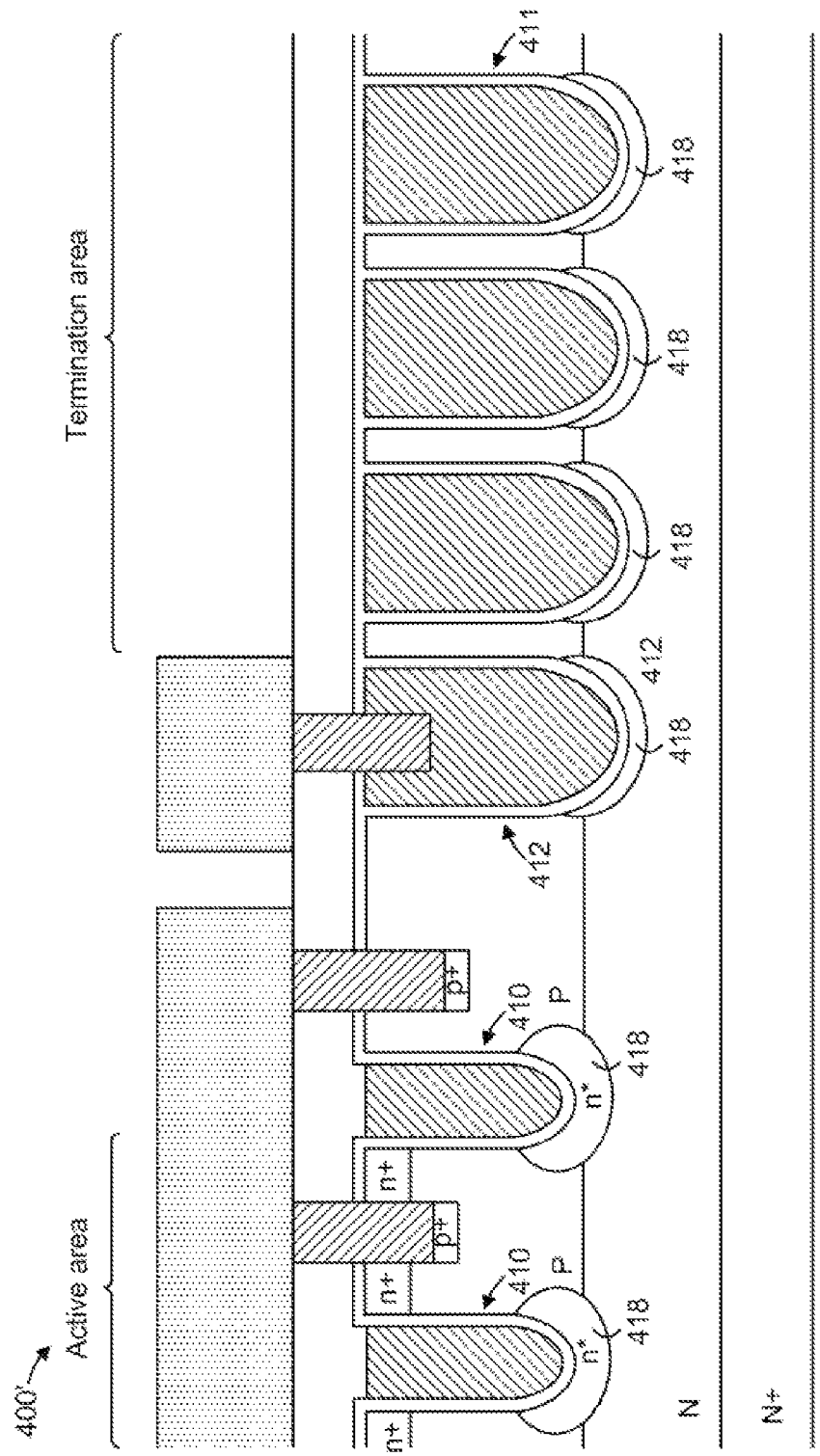
FIG. 9 is a cross-sectional view of another preferred embodiment according to the present invention.

FIG. 9 shows another preferred embodiment of the present invention wherein the N-channel trench MOSFET 400' (the conductivity typo here is not to be taken in a limiting sense, which means it also can be implemented to be a P-channel trench MOSFET formed in a P epitaxial layer onto a P+ substrate) has a similar structure to FIG. 6 except that, an n* doped region 418 is formed wrapping bottom of each of the first type trenched gates 410, the second type trenched gate 412 and the multiple trenched floating gates 411 to further reduce drain-to-source resistance Rds.

Figure 10:
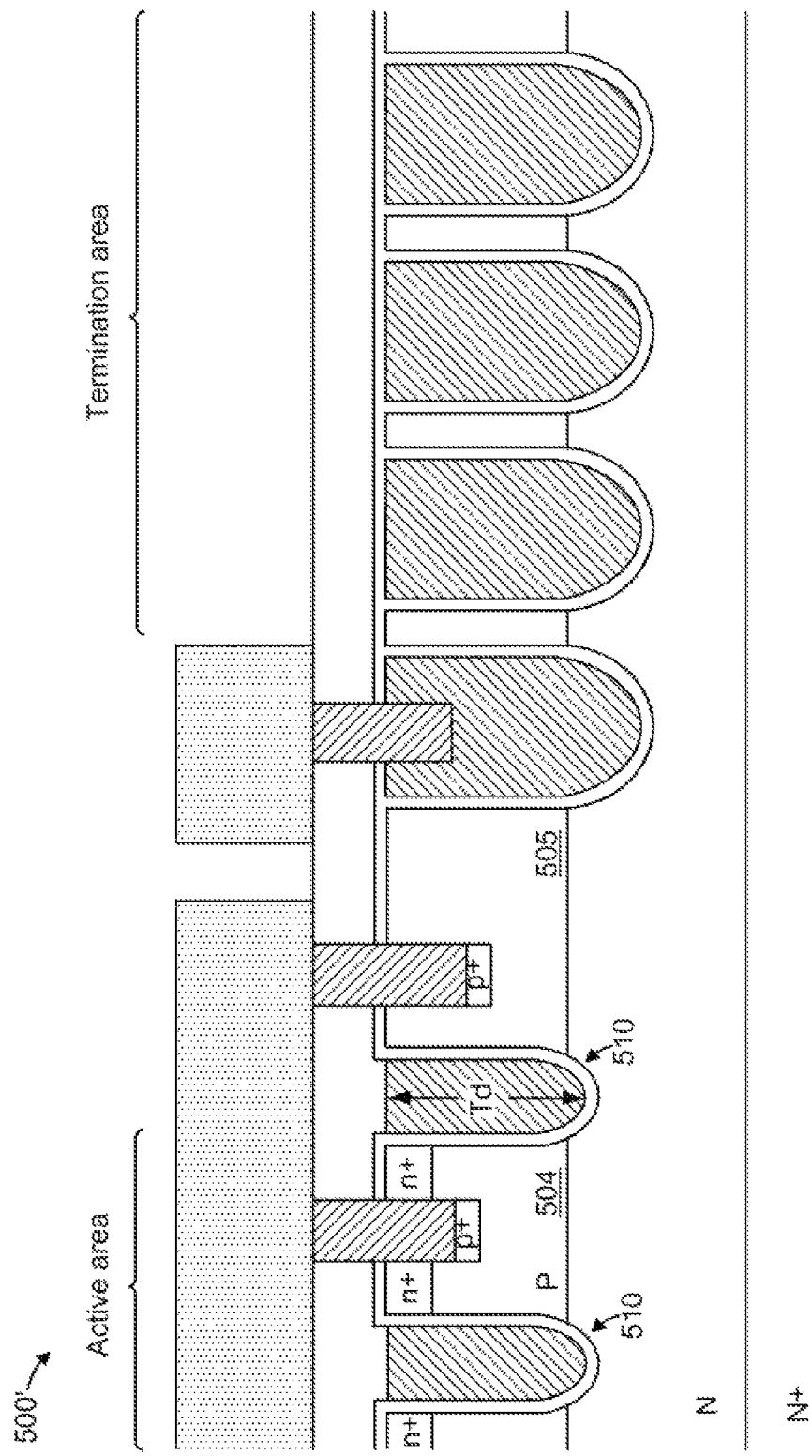
FIG. 10 is a cross-sectional view of another preferred embodiment according to the present invention.

FIG. 10 shows another preferred embodiment of the present invention wherein the N-channel trench MOSFET 500' (the conductivity type here is not to be taken in a limiting sense, which means it also can be implemented to be a P-channel trench MOSFET formed in a P epitaxial layer onto a P+ substrate) has a similar structure to FIG. 6 except that, the trench depth of the first type trenched gates 510 (Td, as illustrated in FIG. 10) in the active area is greater than the body junction of first type P body regions 504 and the second type P body regions 505.

Figure 11:
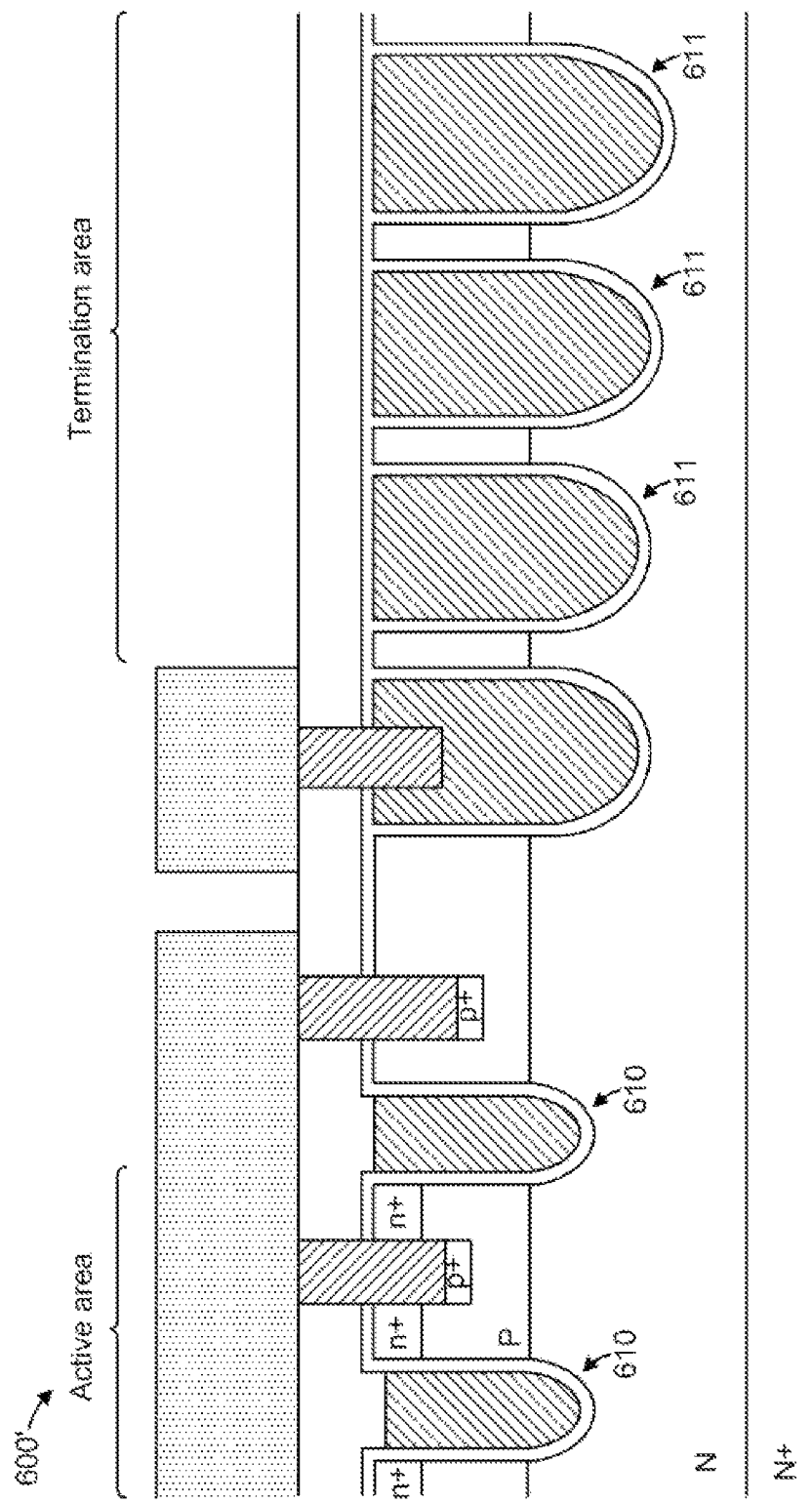
FIG. 11 is a cross-sectional view of another preferred embodiment according to the present invention.

FIG. 11 shows another preferred embodiment of the present invention wherein the N-channel trench MOSFET 600' (the conductivity type here is not to be taken in a limiting sense, which means it also can be implemented to be a P-channel trench MOSFET formed in a P epitaxial layer onto a P+ substrate) has a similar structure to FIG. 10 except that, in the termination area, the multiple trenched floating gates 611 have different trench depth and trench width which are both greater than that of the first type trenched gates 610 in the active area. More specifically, the trench width of the multiple trenched floating gates 611 increases toward the edge of the termination area ($TFw_1 < TFw_2 < TFw_3 \ldots$), which indicates that, the trench depth of the multiple trenched floating gates 611 also increases toward the edge of the termination area ($TFd_1 < TFd_2 < TFd_3 \ldots$) according to FIG. 8. Alternatively, the trench depth of the multiple trenched floating gates 611 can be also implemented to decrease toward the edge of the termination area ($TFw_1 > TFw_2 > TFw_3 \ldots$).

Figure 12:
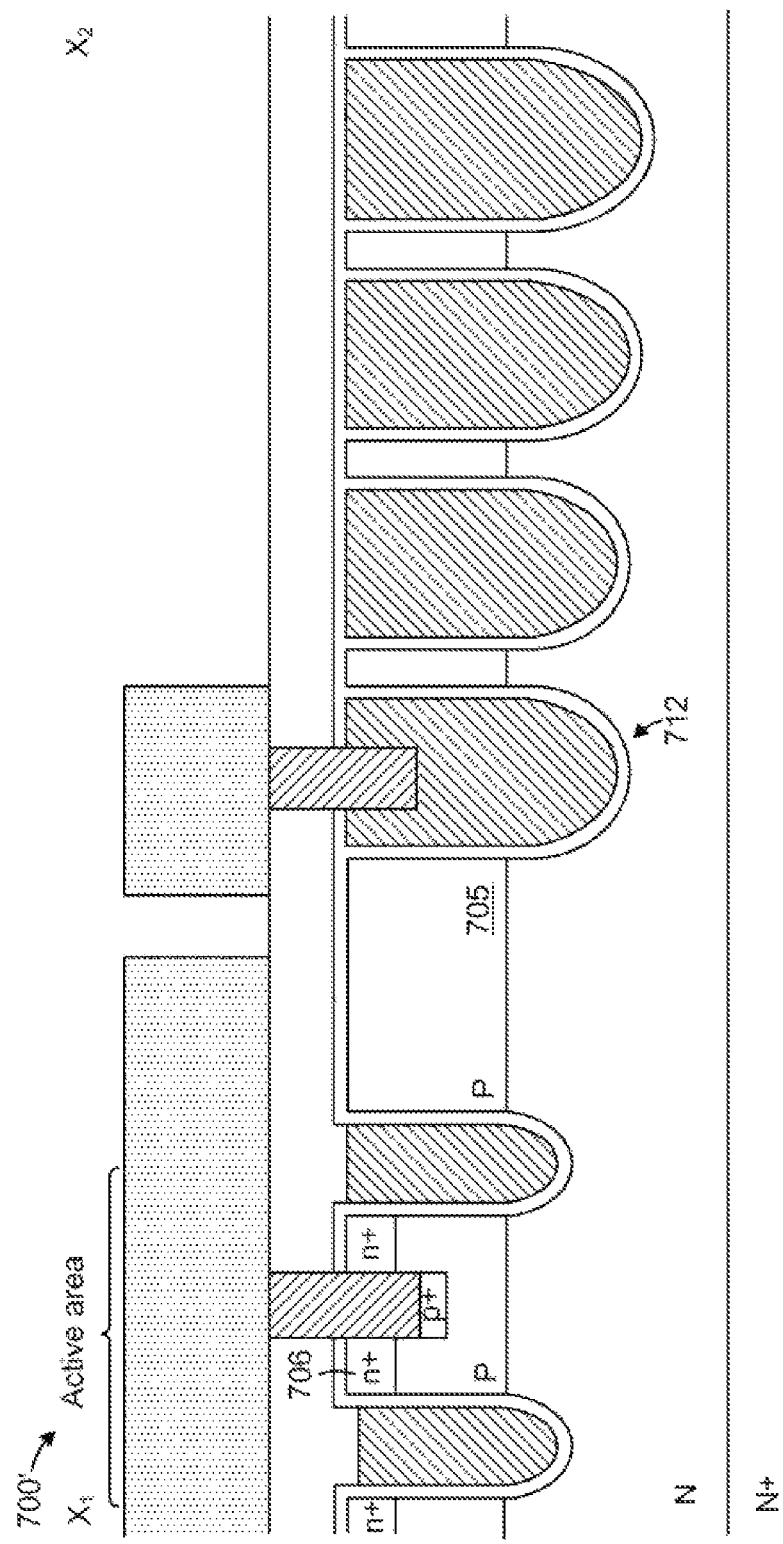
FIG. 12 is a cross-sectional view of another preferred embodiment according to the present invention.
Figure 13:
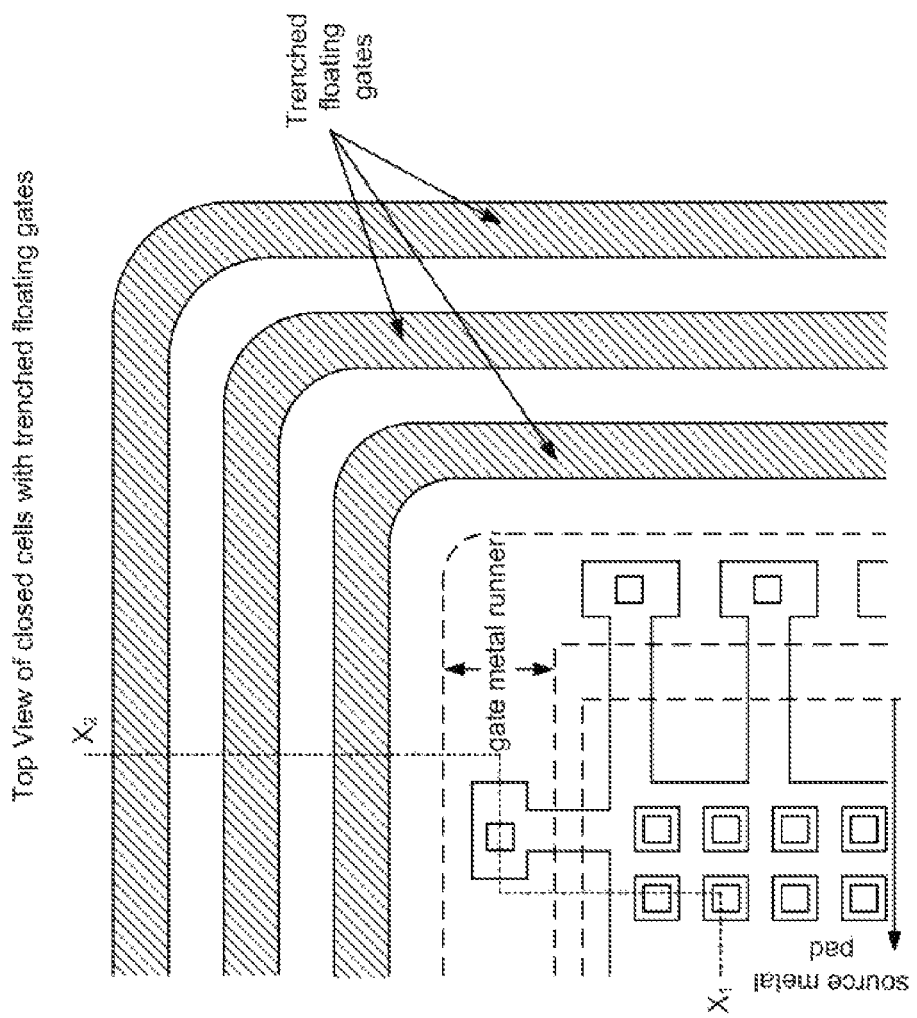
FIG. 13 is a top view of some preferred embodiments having closed cells without trenched body contact according to the present invention.
Figure 14:
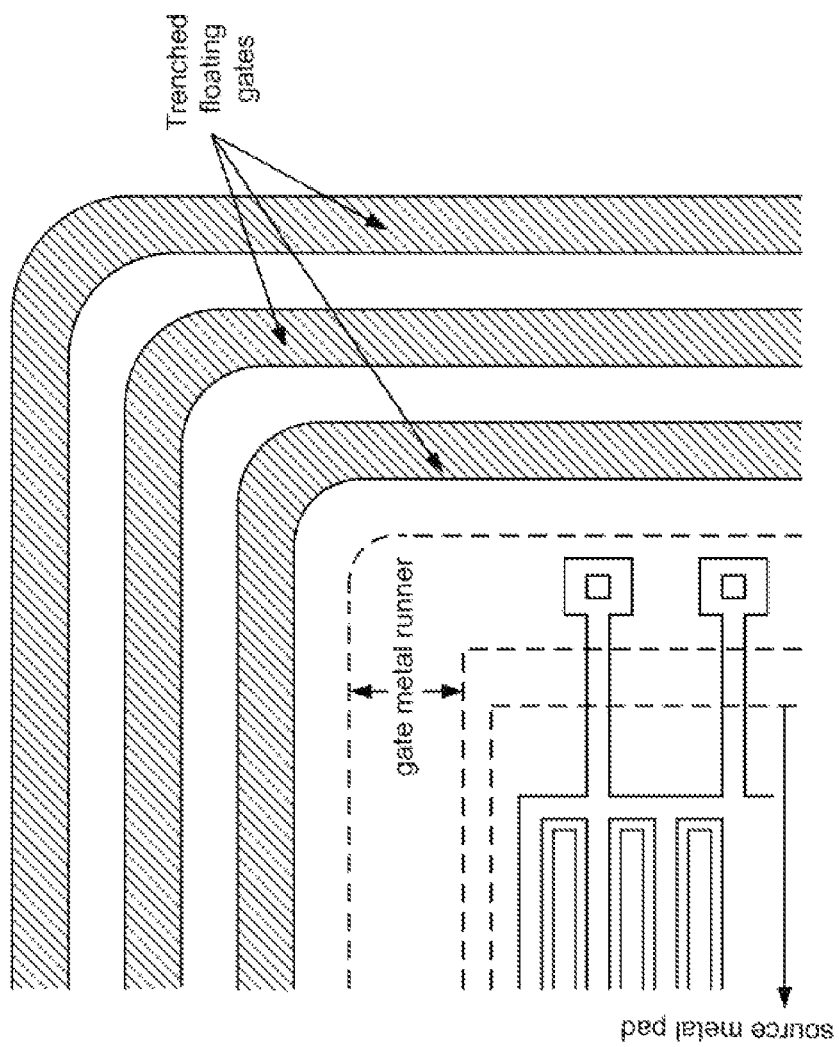
FIG. 14 is a top view of some preferred embodiments having stripe cells without trenched body contact according to the present invention.

FIG. 12 shows another preferred embodiment of the present invention, which is also a preferred $X1$-$X_2$ cross section of FIG. 13, wherein the N-channel trench MOSFET 700' has a similar structure to FIG. 11 except that, there is no trenched body contact extending into the second type P body region 705 adjacent the active area, indicating that the second type P body region 705 between the active area and the adjacent second type trenched gate 712 is not connected to the n+ source regions 706 but having floating voltage. The N-channel trench MOSFET 700' further comprises a plurality of closed transistor cells, having top view as shown in FIG. 13 or a plurality of stripe transistor cells, having top view as shown in FIG. 14.

Figure 15:
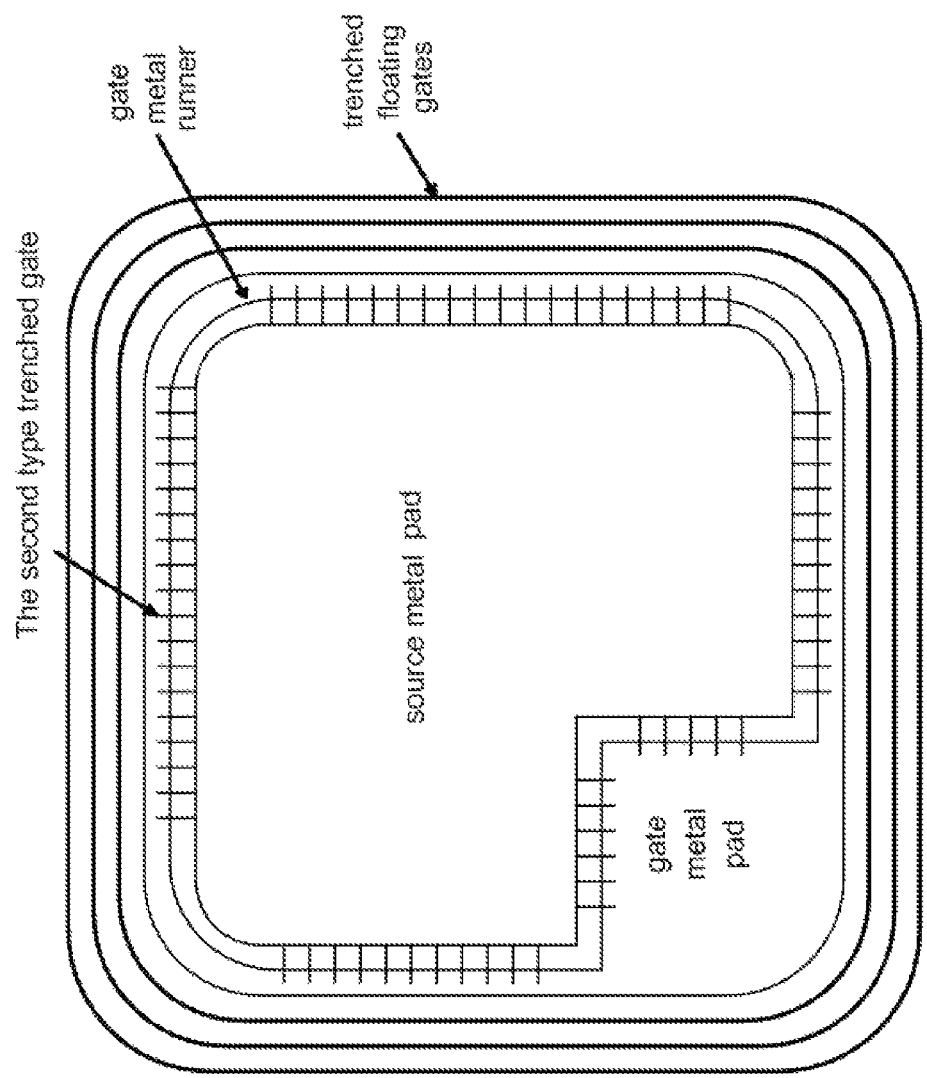
FIG. 15 is a top view of a trench MOSFET with gate metal runner according two the present invention.

FIG. 15 shows that the second type trenched gate for gate contact is formed underneath the gate metal pad as well as underneath a gate metal runner which surrounds outside the source metal pad and extends to the gate metal pad, wherein the gate metal runner is also surrounded by the trenched floating gates in the termination area.

Figure 16:
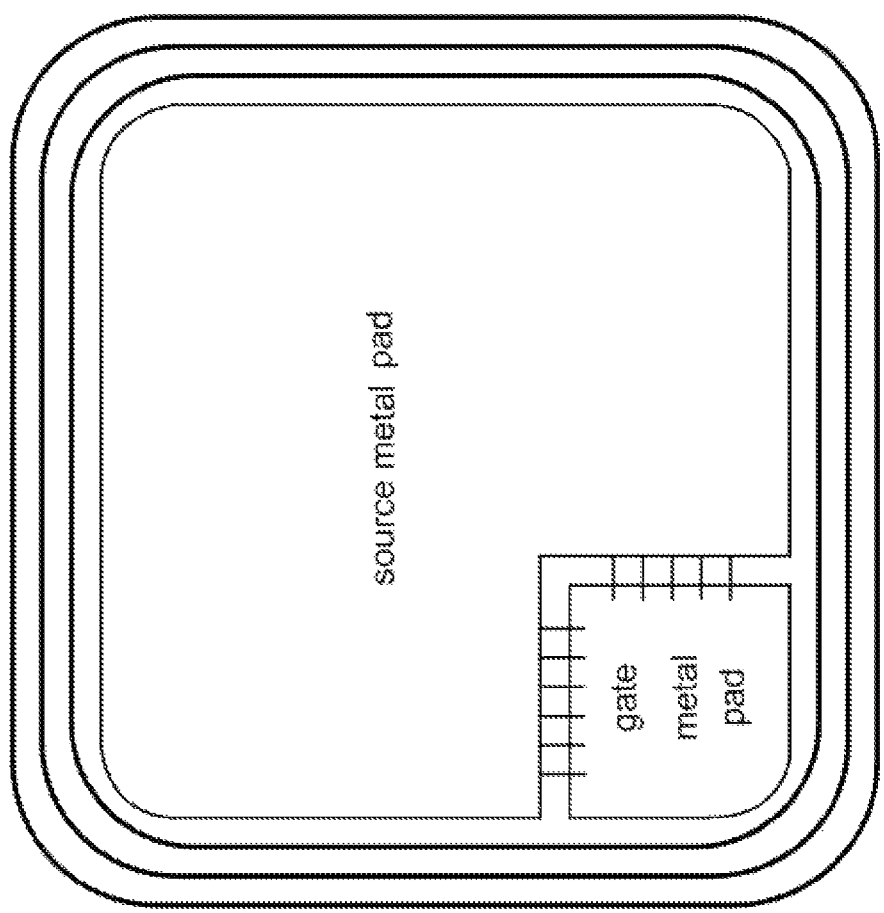
FIG. 16 is a top view of a trench MOSFET without gate metal runner according to the present invention.

FIG. 16 shows that the second type trenched gate for gate contact is formed only underneath the gate metal pad. There is no gate metal runner surrounding the source metal pad.

Figure 17A:
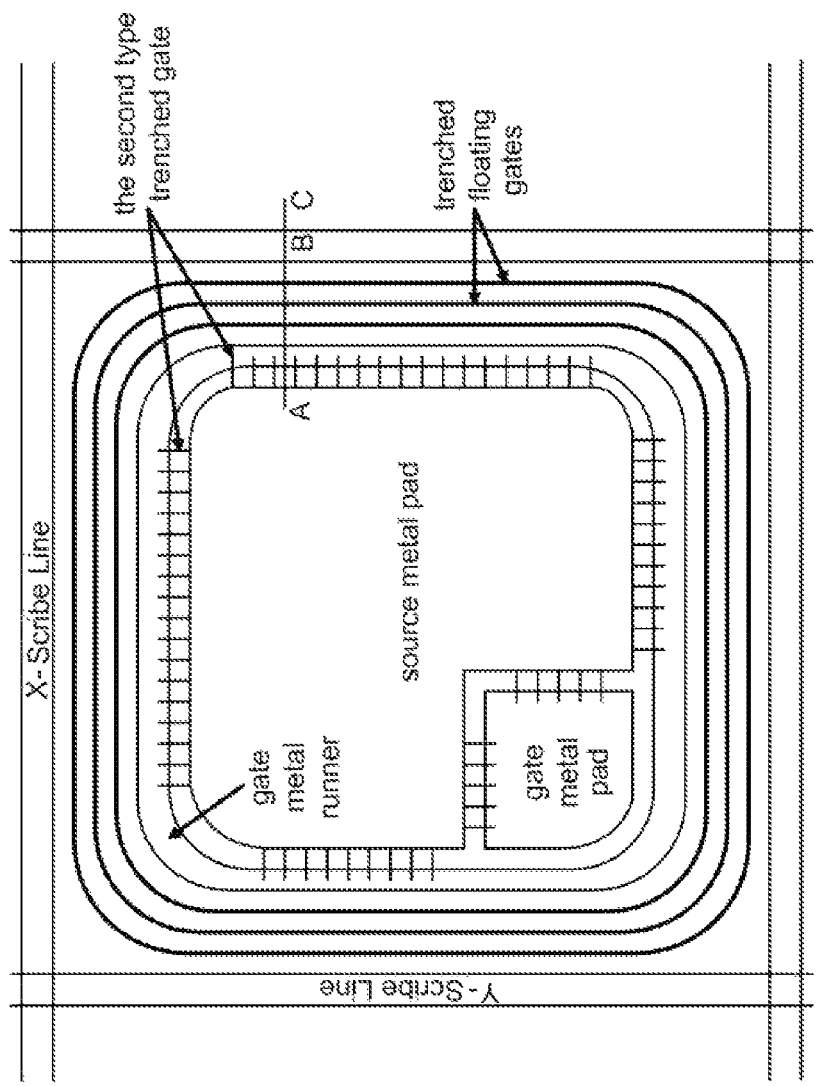
FIG. 17A is top view of another preferred embodiment according to the present invention.

FIG. 17A is a top view of another preferred embodiment showing that the second type trenched gate for gate contact is formed underneath agate metal pad as well as underneath a gate metal runner which surrounds outside the source metal pad and extends to the gate metal pad, wherein the gate metal runner is also surrounded by the multiple trenched floating gates in the termination area, wherein the termination area is further surrounded by scribe lines where to be sawed before assembly.

Figure 17B:
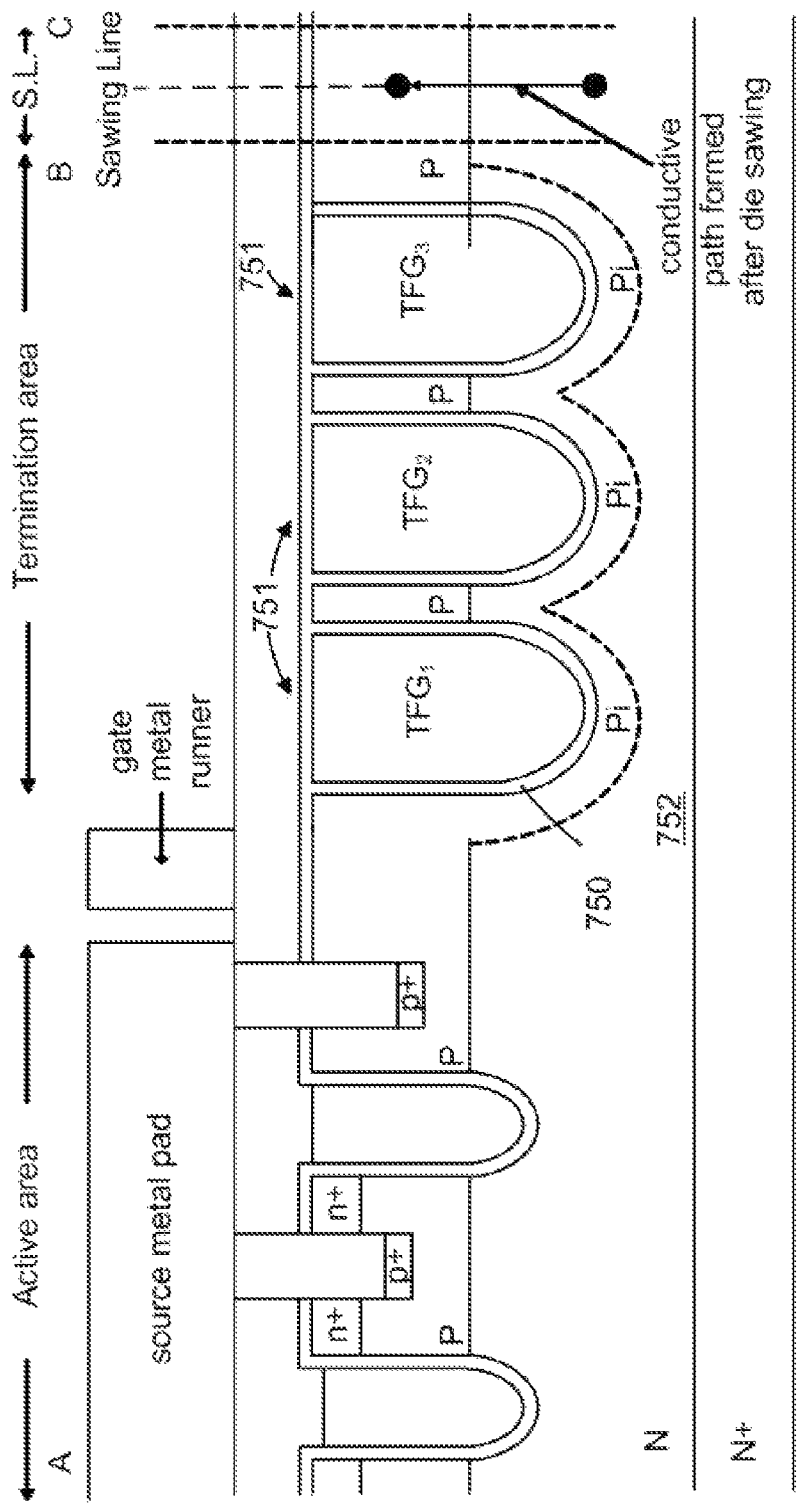
FIG. 17B is a cross-section view showing a preferred A-B-C cross section of FIG. 17A.

FIG. 17B shows a preferred A-B-C cross section of FIG. 17A wherein the termination area comprising a plurality of trenched floating gates 751 ($TFG_1$, $TFG_2$ and $TFG_3$, as illustrated in FIG. 17B) is surrounded by the scribe line (S.L., as illustrated in FIG. 15B). Take an N-channel trench MOSFET as an example, if there is enough negative charge built in the gate oxide layer 750, the plurality of trenched floating gates 751 may induce positive charge forming multiple P type channeling regions (Pi, as illustrated in FIG. 17B) along an interface between the trenched floating gates 751 and the N epitaxial layer 752, causing a leakage path between N type drain region and the n+ source region through a conductive path formed in the scribe line by die sawing (as illustrated in FIG. 17B). Therefore, a channel stop structure is required for prevention of the leakage path formation between the drain region and the source region.

Figure 18A:
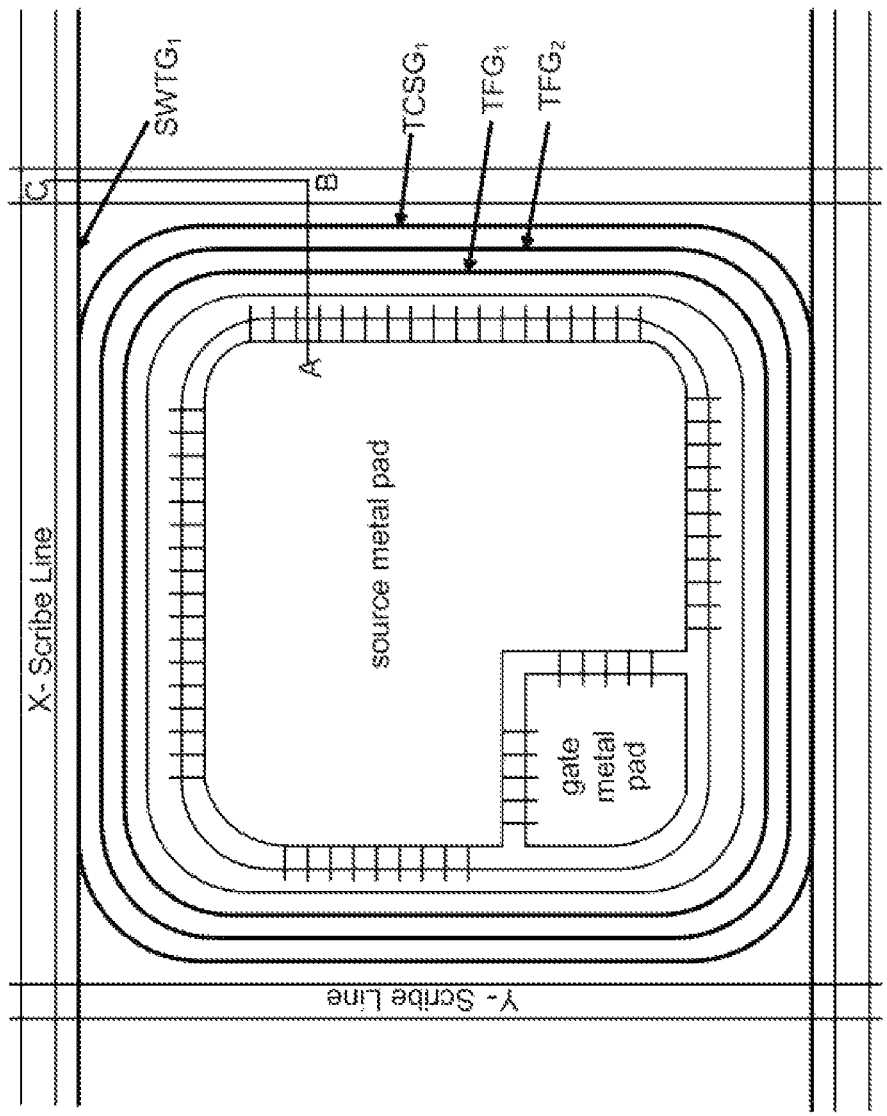
FIG. 18A is a top view of another preferred embodiment according to the present invention.

FIG. 18A is a top view of another preferred embodiment showing that a trenched channel stop gate ($TCSG_1$, as illustrated in FIG. 18A) functioning as the channel stop structure is formed outside of the trenched floating gates (TFG1 and TFG2, as illustrated in FIG. 18A, there can be more than two trenched floating gates in other preferred embodiments as alternative) in the termination area which is further surrounded by X-scribe line (in X direction) and Y-scribe line (in Y direction). The trenched channel stop gate $TCSG_1$ is further connected to a sawing trenched gate ($SWTG_1$, as illustrated in FIG. 18A) which is cross and sawed in the Y-scribe line during the die sawing.

Figure 18B:
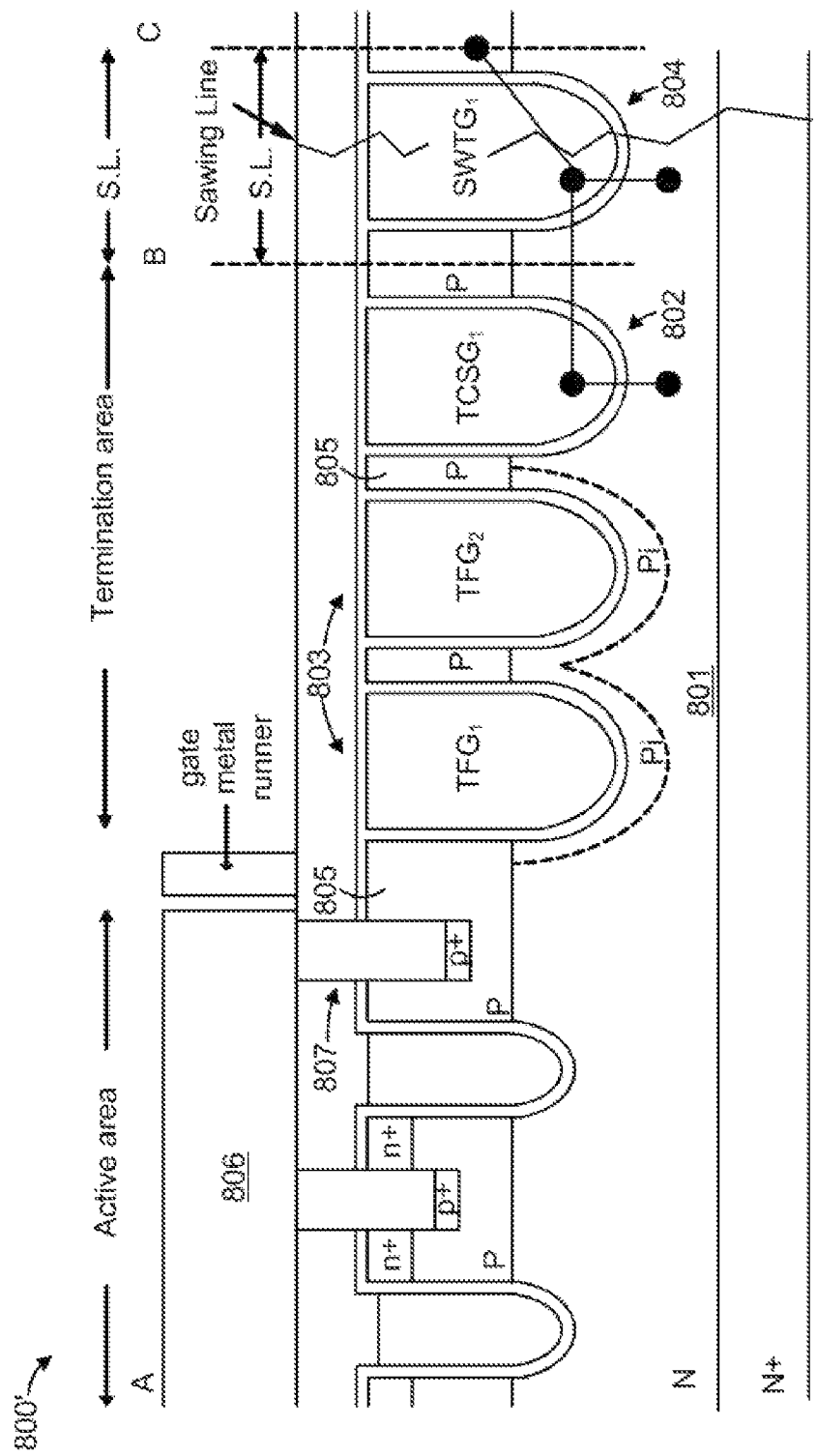
FIG. 18B is a cross-section view showing a preferred A-B-C cross section of FIG. 18A.

FIG. 18B shows another preferred embodiment of the present invention which is also a preferred A-B-C cross section of FIG. 18A, wherein an N-channel trench MOSFET 800' is formed in an N-epitaxial layer 801. In the termination area, a trenched channel stop gate 802 ($TCSG_1$) is formed around outside of a plurality of trenched floating gates 803 ($TFG_1$ and $TFG_2$) and connecting to a sawing trenched gate 804 ($SWTG_1$) cross the Y-scribe line, wherein the sawing trenched gate 804 is sawed in the Y-Scribe line to ensure that the sawing trenched gate 804 and the trenched channel stop gate 802 are electrically shorted both to the N type epitaxial layer 801, the N+ drain region in the termination area, and to the second type body region 805 surrounding the sawing trenched gate 804 (illustrated by the black dots connected by lines in FIG. 18B). Because the trenched channel stop gate 802 is electrically shorted to the N type drain region, there is no channeling region Pi formed surrounding the trenched channel stop gate 802 below the second type P body region 805, therefore, the trenched channel stop gate 802 is acted to stop the channeling region for prevention of leakage path formation between the drain region and the source region as illustrated in FIG. 17B. Besides, the second type P body region 805 adjacent the active area is connected to the source metal pad 806 through a trenched body contact 807, and the other second type P body regions 805 between the $TFG_1$ and the $TCSG_1$ all have floating voltage.

FIG. 18C shows another preferred embodiment of the present invention, which is also a preferred A-B-C cross section of FIG. 18A, wherein the N-channel trench MOSFET 810' has a similar structure to FIG. 18B except that, the P body region 811 adjacent the active area is not connected to the source metal pad through a trenched body contact but having floating voltage.

Figure 19:
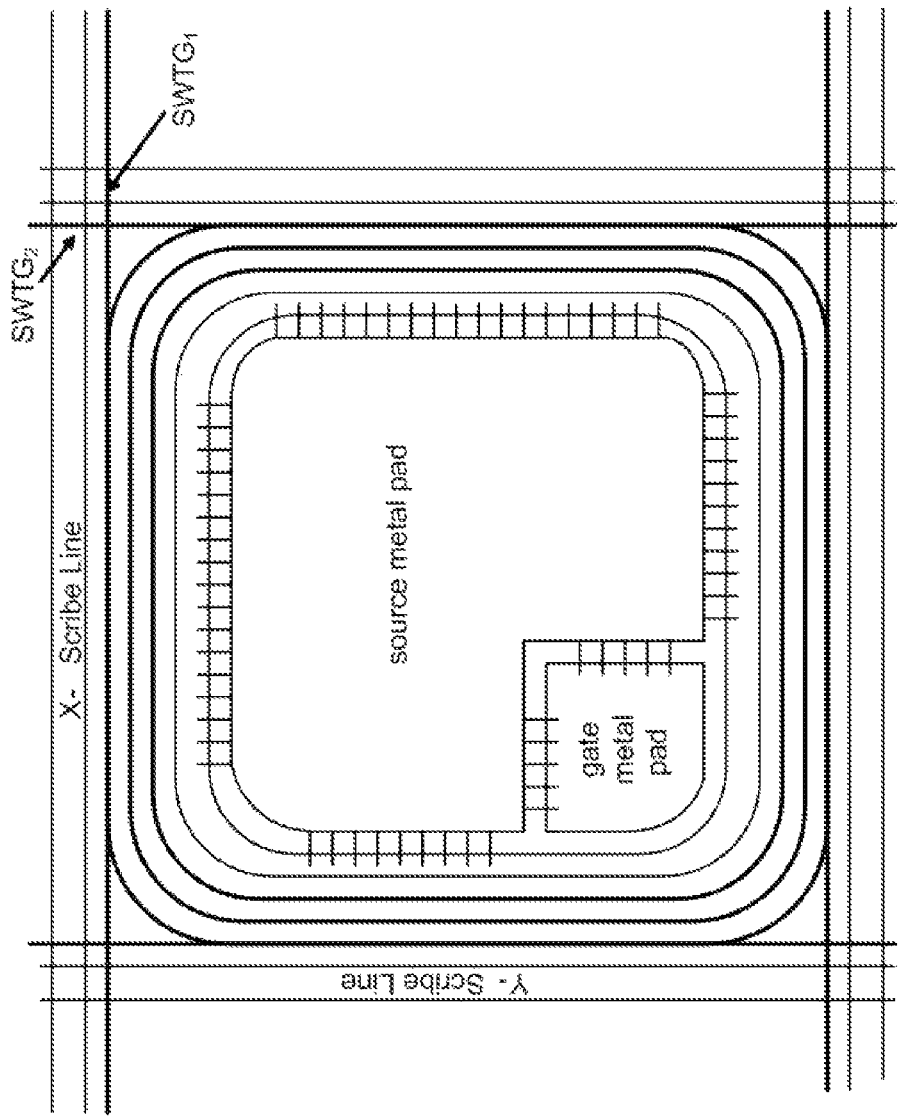
FIG. 19 is a top view showing another preferred embodiment according to the present invention.

FIG. 19 is a top view showing another preferred embodiment according to the present invention, which has a similar structure to FIG. 18A except that, in FIG. 19 there are two sawing trenched gates (SWTG$_1$ and SWTG$_2$) surrounding the termination area, wherein SWTG$_1$ is cross the Y-scribe while SWTG$_2$ is cross X-scribe line.

Figure 20:
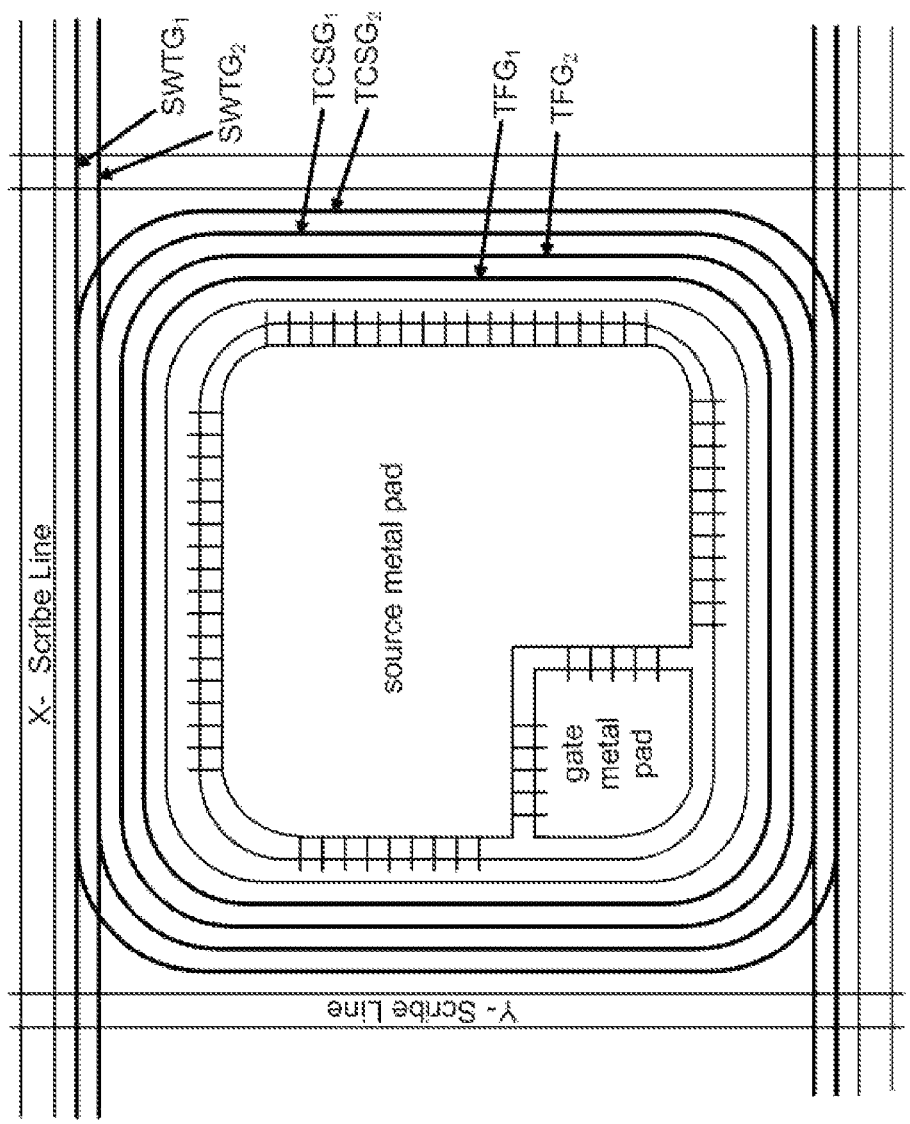
FIG. 20 is a top view showing another preferred embodiment according to the present invention.

FIG. 20 is a top view showing another preferred embodiment according to the present invention, which has a similar structure to FIG. 18A except that, in FIG. 20 the trenched floating gates (TFG$_1$ and TFG$_2$, or there can be more than two trenched floating gates as alternative) in termination area are surrounded by two trenched channel stop gates (TCSG$_1$ and TCSG$_2$) which are farther surrounded by two sawing trenched gates (SWTG$_1$ and SWTG$_2$) cross the Y-Scribe line.

Figure 21A:
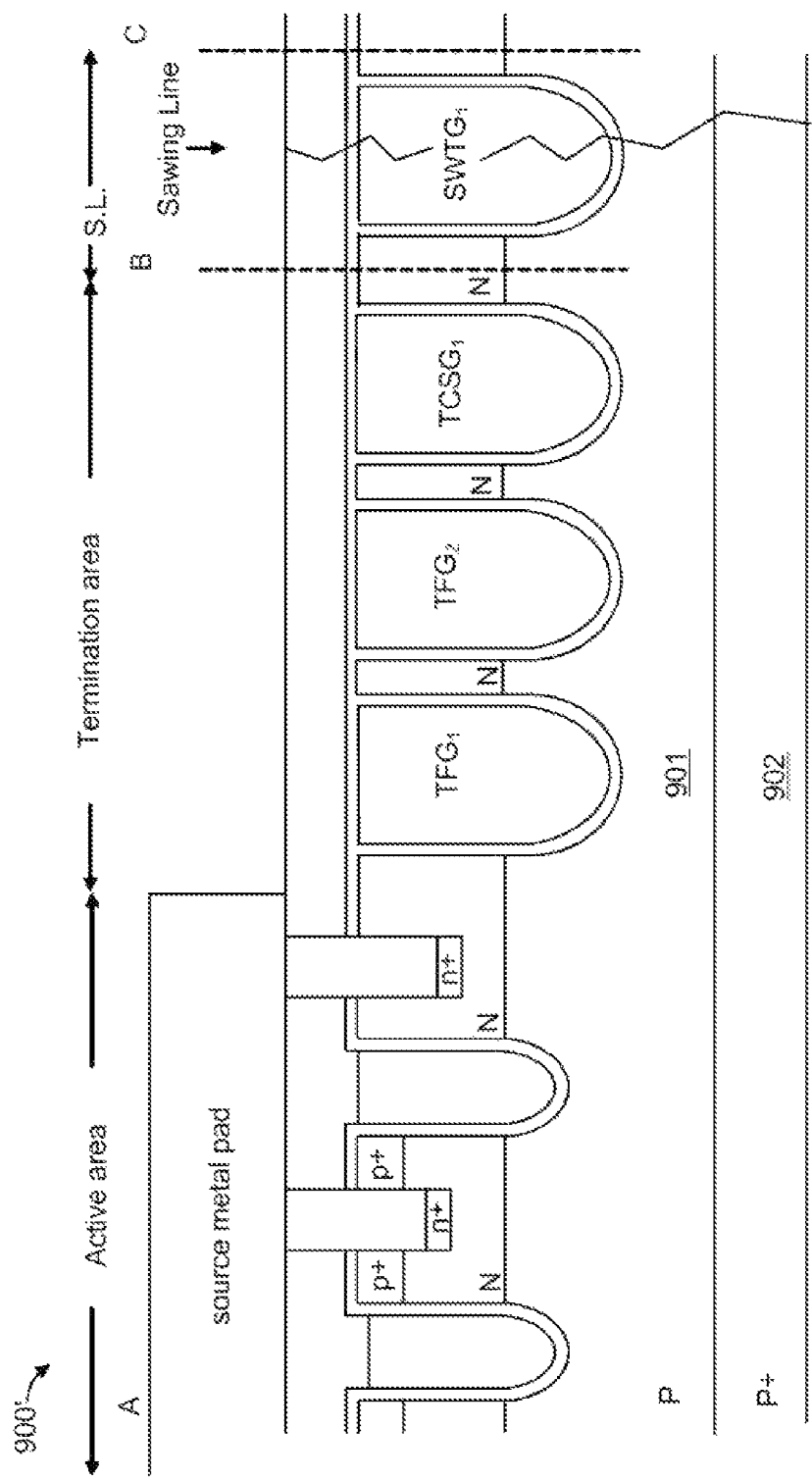
FIG. 21A is a cross-section view of another preferred embodiment according to the present invention.

FIG. 21A shows another preferred embodiment of the present invention, which has a similar structure to FIG. 18B except that, the trench MOSFET 900' in FIG. 21A is a P-channel trench MOSFET, which is formed in a P type epitaxial layer 901 onto a P+ substrate 902.

Figure 21B:
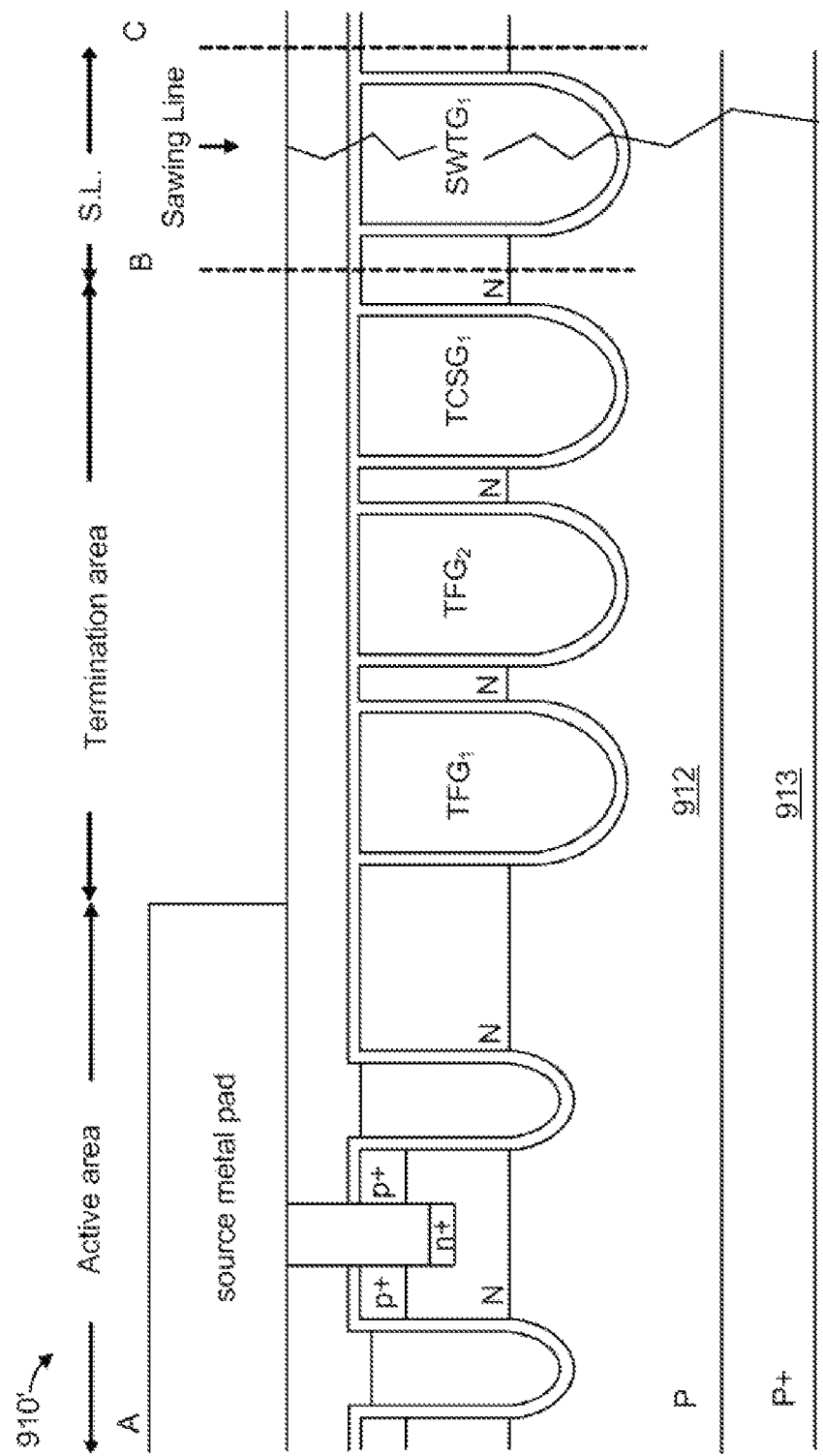
FIG. 21B is a cross-section view of another preferred embodiment according to the present invention.

FIG. 21B shows another preferred embodiment of the present invention, which has a similar structure to FIG. 18C except that, the trench MOSFET 910' in FIG. 21B is a P-channel trench MOSFET, which is formed in a P type epitaxial layer 912 onto a P+ substrate 913.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench MOSFET with a plurality of transistor cells in active area and multiple trenched floating gates in termination area, comprising:
    an epitaxial layer of a first conductivity type onto a substrate of said first conductivity type, wherein said epitaxial layer having a lower doping concentration than said substrate;
    a plurality of source regions of said first conductivity type formed near top surface of said epitaxial layer only in said active area, said source regions being connected to a source metal pad and having a higher doping concentration than said epitaxial layer;
    a plurality of first type body regions of a second conductivity type formed underneath said source regions in said active area;
    a plurality of second type body regions of said second conductivity type formed in said epitaxial layer around outside of said active area including said termination area, and said source regions being not disposed on top of said second type body regions;
    a plurality of first type trenched gates in said active area, surrounded by said source regions and said first type body regions;
    at least one second type trenched gate surrounded by said second type body regions and extending to said first type trenched gates for gate contact, wherein said at least one second type trenched gate is connected to a gate metal pad for wire bonding;
    said multiple trenched floating gates formed in parallel in said termination area around outside of said active area, said multiple trenched floating gates having floating voltage and surrounded by said second type body region, having trench depth equal to or deeper than body junction of said second type body regions;
    at least one trenched channel stop gate formed in said termination area and around outside of said multiple trenched floating gates, each said trenched channels top gate being connected to at least one sawing trenched gate, wherein each said sawing trenched gate is extended across a scribe line.

2. The trench MOSFET of claim 1, wherein said second type body region adjacent said active area is connected to said source metal pad through a trenched body contact.

3. The trench MOSFET of claim 1, wherein said second type body region adjacent said active area is not connected to said source metal pad but having floating voltage.

4. The trench MOSFET of claim 1, wherein there is only one trenched channel stop gate formed in said termination area, wherein said only one trenched channel stop gate is connected to at least one sawing trenched gate.

5. The trench MOSFET of claim 1, wherein there are multiple trenched channel stop gates formed in said termination area, wherein each of said trenched channel stop gates is connected to at least one sawing trenched gate.

6. The trench MOSFET of claim 1, wherein said first conductivity type is N type and said second conductivity type is P type.

7. The trench MOSFET of claim 1, wherein said first conductivity type is P type and said second conductivity type is N type.

8. The trench MOSFET of claim 1, wherein said transistor cells in said active area are closed cells.

9. The trench MOSFET of claim 1, wherein said transistor cells in said active area are stripe cells.

10. The trench MOSFET of claim 1, wherein said at least one second type trenched gate is only disposed underneath said gate metal pad.

11. The trench MOSFET of claim 1 further comprising a gate metal runner surrounding outside of said active area and extending to said gate metal pad, wherein said at least one second type trenched gate is disposed not only underneath said gate metal pad, but also underneath said gate metal runner.

12. The trench MOSFET of claim 1 further comprising a doped region of said first conductivity type with doping concentration higher than said epitaxial layer wrapping bottoms of said first type trenched gates, said at least one second type trenched gate, said sawing trenched gate and said multiple trenched floating gates.

13. The trench MOSFET of claim 1, wherein said multiple trenched floating gates in said termination area have same trench width and same trench depth as said first type trenched gates in said active area.

14. The trench MOSFET of claim 1, wherein said multiple trenched floating gates in said termination area have greater trench width and greater trench depth than said first type trenched gates in said active area.

15. The trench MOSFET of claim 14, wherein the trench width of said multiple trenched floating gates increases toward the edge of said termination area.

16. The trench MOSFET of claim 14, wherein the trench width of said multiple trenched floating gates decreases toward the edge of said termination area.

17. The trench MOSFET of claim 1, wherein said trenched channel stop gate and said sawing trenched gate are electrically shorted to a drain region and said second type body region around said termination area.

* * * * *